US011282420B2

United States Patent
Han et al.

(10) Patent No.: US 11,282,420 B2
(45) Date of Patent: Mar. 22, 2022

(54) ELECTRONIC PANEL AND ELECTRONIC APPARATUS INCLUDING THE SAME

(71) Applicant: Samsung Display Co., Ltd., Yongin-si (KR)

(72) Inventors: Jeongyun Han, Hwaseong-si (KR); Jong-Hwa Kim, Yongin-si (KR); Kyungsu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 167 days.

(21) Appl. No.: 16/696,896

(22) Filed: Nov. 26, 2019

(65) Prior Publication Data
US 2020/0175900 A1    Jun. 4, 2020

(30) Foreign Application Priority Data

Nov. 29, 2018 (KR) .................. 10-2018-0151211

(51) Int. Cl.
*G09G 3/00* (2006.01)
*H01L 51/00* (2006.01)

(52) U.S. Cl.
CPC ......... *G09G 3/006* (2013.01); *H01L 51/0031* (2013.01); *G09G 2330/12* (2013.01)

(58) Field of Classification Search
CPC ............... G09G 3/006; G09G 2330/12; G09G 2300/0413; G09G 2310/0232; G09G 2300/0426; G09G 2330/08; H01L 51/0031; H01L 27/3258; H01L 51/5237; H01L 27/3246; H01L 27/323; H01L 51/52;
(Continued)

(56) References Cited

U.S. PATENT DOCUMENTS 9,581,841 B2   2/2017   Yanagisawa
9,653,368 B2   5/2017   Kwak et al.
(Continued)

FOREIGN PATENT DOCUMENTS

JP          6138480 B2    5/2017
KR   10-2016-0017845 A    2/2016
(Continued)

OTHER PUBLICATIONS

EPO Extended Search Report dated Jan. 28, 2020, for corresponding European Patent Application No. 19211864.4 (9 pages).

*Primary Examiner* — Giovanni Astacio-Oquendo
(74) *Attorney, Agent, or Firm* — Lewis Roca Rothgerber Christie LLP

(57) ABSTRACT

An electronic panel includes a base substrate having a first area, a second area adjacent to the first area, and a third area adjacent to the second area, a plurality of pixels in the second area, a plurality of pixel signal lines in the third area and connected to the pixels, a crack detecting pattern spaced apart from the pixels and in the first area, a first line spaced apart from the pixel signal lines, in the third area, and connected to a portion of the crack detecting pattern, and a second line spaced apart from the pixel signal lines, in the third area, connected to another portion of the crack detecting pattern, and spaced apart from the first line. The crack detecting pattern has a line-symmetrical shape with respect to a symmetry axis passing through a center of the first area.

19 Claims, 21 Drawing Sheets

(58) Field of Classification Search
CPC ............. H01L 51/5256; H01L 27/3276; G06F 3/0443; G06F 3/0446; G09F 9/30
USPC ...................................... 324/750.3, 537, 500
See application file for complete search history.

(56) References Cited

U.S. PATENT DOCUMENTS

| | | |
|---|---|---|
| 9,940,888 B2 | 4/2018 | Ryoo et al. |
| 9,947,255 B2 | 4/2018 | Zhang et al. |
| 10,210,782 B2 | 2/2019 | Lee et al. |
| 10,996,782 B2 * | 5/2021 | Park ..................... G06F 3/0443 |
| 11,043,438 B2 * | 6/2021 | Jang .................... H01L 27/3255 |
| 11,047,823 B2 * | 6/2021 | Lee ....................... H01L 27/323 |
| 2016/0140896 A1 | 5/2016 | Kwon et al. |
| 2017/0162637 A1 | 6/2017 | Choi et al. |
| 2017/0263880 A1 | 9/2017 | Lee et al. |
| 2018/0053792 A1 | 2/2018 | Shin et al. |
| 2021/0313411 A1 * | 10/2021 | Jung ................... H01L 27/3276 |
| 2021/0320276 A1 * | 10/2021 | Chang ................ H01L 51/5253 |
| 2021/0335895 A1 * | 10/2021 | Feng ..................... G06F 3/0412 |

FOREIGN PATENT DOCUMENTS

| | | |
|---|---|---|
| KR | 10-2017-0064598 A | 6/2017 |
| KR | 10-2017-0107136 A | 9/2017 |
| KR | 10-2018-0014906 A | 2/2018 |

* cited by examiner

ELECTRONIC PANEL AND ELECTRONIC APPARATUS INCLUDING THE SAME

CROSS-REFERENCE TO RELATED APPLICATION

This application claims priority to and the benefit of Korean Patent Application No. 10-2018-0151211, filed on Nov. 29, 2018, the entire contents of which are hereby incorporated by reference.

BACKGROUND

The present disclosure herein relates to an electronic panel and an electronic apparatus including the same, and more particularly, to an electronic panel having a through hole for sensing an external input, and an electronic apparatus including the same.

An electronic apparatus is activated by an electrical signal. The electronic apparatus may include various electronic components such as an electronic panel and an electronic module. The electronic panel may include a display unit for displaying an image and/or a sensing unit for sensing an external input. The electronic components may be electrically connected to each other through signal lines variously arranged.

The display unit may include a light emitting element for generating an image. The sensing unit may include sensing electrodes for sensing an external input. The sensing electrodes may be disposed in an active area. The sensing unit may be designed to provide sensitivity which is uniform in the entire active area.

SUMMARY

The present disclosure may provide an electronic panel with improved reliability and an electronic apparatus including the same.

In an embodiment of the inventive concepts, an electronic panel includes a base substrate having a first area, a second area adjacent to the first area, and a third area adjacent to the second area, a plurality of pixels in the second area, a plurality of pixel signal lines in the third area and connected to the pixels, a crack detecting pattern spaced apart from the pixels and located in the first area, a first line spaced apart from the pixel signal lines, located in the third area, and connected to a portion of the crack detecting pattern, and a second line spaced apart from the pixel signal lines, located in the third area, connected to another portion of the crack detecting pattern, and spaced apart from the first line. The crack detecting pattern has a line-symmetrical shape with respect to a symmetry axis passing through a center of the first area.

In an embodiment, the first area may include a module area and a line area around the module area. The crack detecting pattern may include a first extension portion in the line area, the first extension portion extending along an edge of the module area, and being located at a left side of the symmetry axis, a second extension portion in the line area, the second extension portion extending along the edge of the module area, being spaced apart from the first extension portion, and being located at a right side of the symmetry axis, a third extension portion in the line area, the third extension portion extending along the edge of the module area, being spaced apart from the first and second extension portions, and crossing the symmetry axis, and a first connecting portion and a second connecting portion that are connected to a first end of the first extension portion and a first end of the second extension portion, respectively, and are symmetrical with respect to the symmetry axis.

In an embodiment, the first connecting portion and the second connecting portion may be parallel to the symmetry axis.

In an embodiment, a first end of the third extension portion may be connected to the first connecting portion, and a second end of the third extension portion may be connected to the second connecting portion.

In an embodiment, the first extension portion may include a plurality of first extension portions spaced apart from each other, and the second extension portion may include a plurality of second extension portions spaced apart from each other. The first connecting portion may include a plurality of first connecting portions spaced apart from each other and connected to the first extension portions, respectively, and the second connecting portion may include a plurality of second connecting portions spaced apart from each other and connected to the second extension portions, respectively.

In an embodiment, one of the first connecting portions may be connected to a first end of the third extension portion, and one of the second connecting portions may be connected to a second end of the third extension portion.

In an embodiment, the first connecting portions may be spaced apart from each other along a direction parallel to the symmetry axis, and the second connecting portions may be spaced apart from each other along the direction parallel to the symmetry axis.

In an embodiment, the first connecting portions and the second connecting portions are symmetrical with respect to the symmetry axis.

In an embodiment, the first connecting portions may be aligned with each other along the direction parallel to the symmetry axis, and the second connecting portions may be aligned with each other along the direction parallel to the symmetry axis.

In an embodiment, the electronic panel may further include a hole defined in the module area and penetrating the electronic panel. The crack detecting pattern may be located along an edge of the hole.

In an embodiment, the electronic panel may further include at least one non-light emitting pixel in the module area. The non-light emitting pixel may have a shape obtained by removing at least one of components of the pixel.

In an embodiment, the crack detecting pattern may have an open curve shape including a first end and a second end.

In an embodiment, the electronic panel may further include a first connection line connecting the first line and the first end of the crack detecting pattern, and a second connection line connecting the second line and the second end of the crack detecting pattern. The symmetry axis may pass between the first connection line and the second connection line.

In an embodiment of the inventive concepts, an electronic apparatus includes an electronic panel configured to display an image and to sense an external input, and an electronic module overlapping with the electronic panel. The electronic panel includes a base substrate including a hole area in which a hole is defined, an active area adjacent to the hole area, and a peripheral area adjacent to the active area, and a crack detecting circuit including a crack detecting pattern in the hole area and having an open curve shape along an edge of the hole, a first crack detecting line in the peripheral area and connected to a first end of the crack detecting pattern, and a second crack detecting line spaced apart from the first crack detecting line, in the peripheral area, and connected to a second end of the crack detecting pattern. The crack detecting pattern has a line-symmetrical shape with respect to a symmetry axis passing through a center of the hole area.

In an embodiment, the crack detecting pattern may have a single unitary body shape.

In an embodiment, the crack detecting pattern may include a first extension portion at a left side of the symmetry axis, a second extension portion at a right side of the symmetry axis, a third extension portion crossing the symmetry axis, a first connecting portion connecting the first extension portion and a first end of the third extension portion, and a second connecting portion connecting the second extension portion and a second end of the third extension portion. The first extension portion and the second extension portion may be spaced apart from each other with the symmetry axis interposed therebetween and may be line-symmetrical with respect to the symmetry axis. The first connecting portion and the second connecting portion may be spaced apart from each other with the symmetry axis interposed therebetween and may be line-symmetrical with respect to the symmetry axis.

In an embodiment, a minimum distance between the third extension portion and the first extension portion may be substantially equal to a minimum distance between the third extension portion and the second extension portion.

In an embodiment, the crack detecting circuit may further include a first connection line connecting the first end of the crack detecting pattern and the first crack detecting line, and a second connection line connecting the second end of the crack detecting pattern and the second crack detecting line. The symmetry axis may pass between the first connection line and the second connection line.

In an embodiment, the first connection line and the second connection line may be connected to the first crack detecting line and the second crack detecting line via the active area.

In an embodiment, the electronic panel may further include a plurality of sensing electrodes located at the active area and including a sensing insulating layer, first conductive patterns located under the sensing insulating layer, and second conductive patterns located at the sensing insulating layer. The crack detecting pattern may be located at the same layer as the second conductive patterns.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION

Figure 1A:
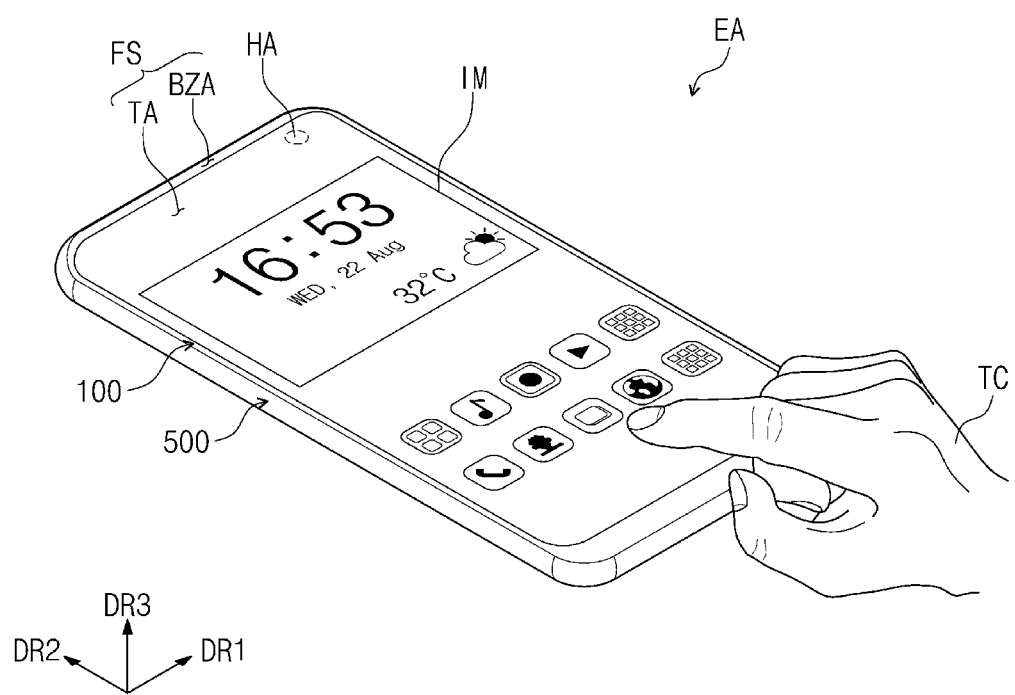
FIG. 1A is an assembled perspective view illustrating an electronic apparatus according to an embodiment of the inventive concepts.

The inventive concepts now will be described more fully hereinafter with reference to the accompanying drawings, in which various embodiments are shown. The inventive concepts may, however, be embodied in many different forms, and should not be construed as limited to the embodiments set forth herein. Rather, these embodiments are provided so that this disclosure will be thorough and complete, and will fully convey the scopes of the inventive concepts to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the inventive concepts will be described in detail with reference to the accompanying drawings.

Figure 1B:
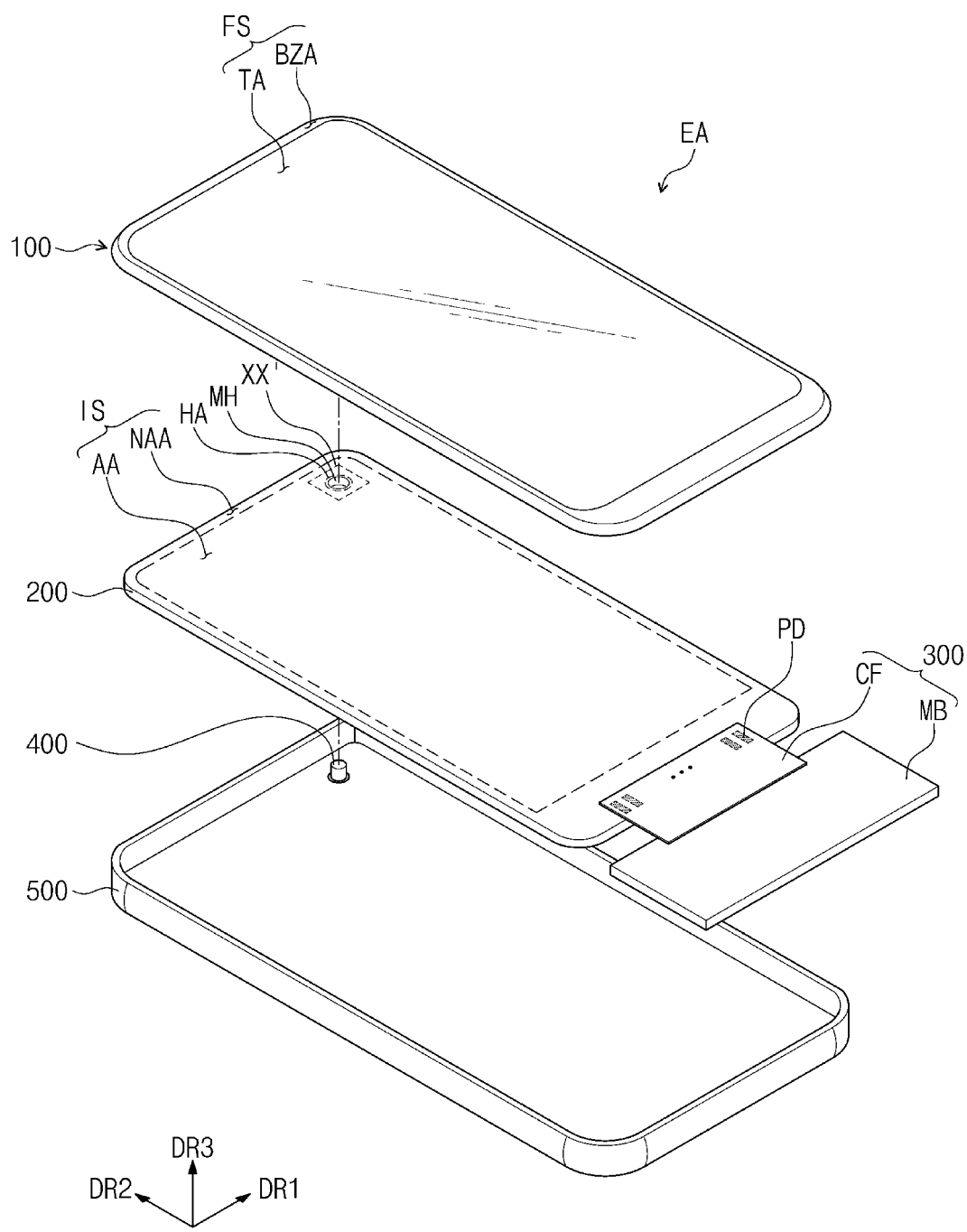
FIG. 1B is an exploded perspective view illustrating the electronic apparatus of FIG. 1A.
Figure 2:
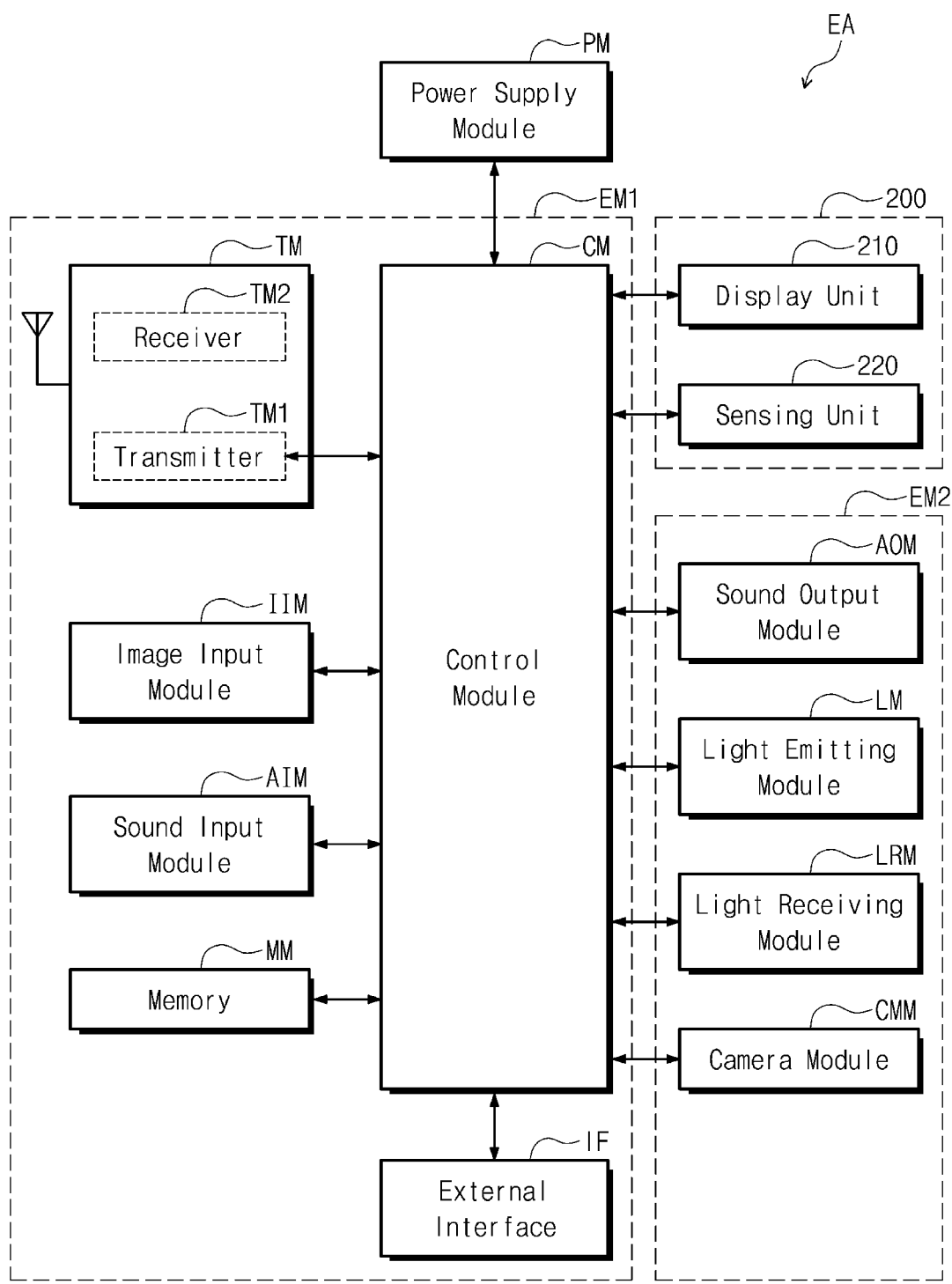
FIG. 2 is a block diagram of the electronic apparatus of FIG. 1A.

FIG. 1A is an assembled perspective view illustrating an electronic apparatus according to an embodiment of the inventive concepts. FIG. 1B is an exploded perspective view illustrating the electronic apparatus of FIG. 1A. FIG. 2 is a block diagram of the electronic apparatus of FIG. 1A. Hereinafter, an embodiment of the inventive concepts will be described with reference to FIGS. 1A-2.

An electronic apparatus EA may be activated by an electrical signal. The electronic apparatus EA may be realized as various embodiments. For example, the electronic apparatus EA may be realized as a tablet, a notebook computer, a personal computer, a smart television, a smart phone or any other suitable electronic device. In the present embodiment, the smart phone is illustrated as an example of the electronic apparatus EA.

As illustrated in FIG. 1A, the electronic apparatus EA may display an image IM on its front surface FS. The front surface FS may be parallel to a plane defined by a first direction DR1 and a second direction DR2. The front surface FS may include a transmission area TA and a bezel area BZA adjacent to the transmission area TA.

The electronic apparatus EA may display the image IM in the transmission area TA. The image IM may include at least one of a static image or a dynamic image. A clock image and a plurality of icons are illustrated as an example of the image IM in FIG. 1A.

The transmission area TA may have a quadrilateral shape (e.g., a rectangular shape) parallel to the first and second directions DR1 and DR2. However, embodiments of the inventive concepts are not limited thereto. In other embodiments, the shape of the transmission area TA may be variously modified.

The bezel area BZA may be adjacent to the transmission area TA. The bezel area BZA may surround the transmission area TA when viewed in a plan view. However, embodiments of the inventive concepts are not limited thereto. In other embodiments, the bezel area BZA may be adjacent to only one side of the transmission area TA or may be omitted. The electronic apparatus EA according to the embodiment of the inventive concepts may be variously embodied and is not limited to a specific embodiment.

A normal direction of the front surface FS may correspond to a thickness direction DR3 (hereinafter, referred to as a third direction) of the electronic apparatus EA. In the present embodiment, a front surface (or a top surface) and a rear surface (or a bottom surface) of each member may be defined based on a direction (e.g., the third direction DR3) in which the image IM is displayed. The front surface and the rear surface may be opposite to each other in the third direction DR3.

However, directions indicated by the first to third directions DR1, DR2 and DR3 may be relative concepts and may be changed into other directions. Hereinafter, the first to third directions are the directions indicated by the first to third directions DR1, DR2 and DR3 illustrated in FIG. 1A, respectively.

In some embodiments, the electronic apparatus EA may sense a user's input TC applied from the outside. For example, the user's input TC may include at least one of various kinds of external inputs such as a part (e.g., a finger) of a user's body, light, heat, and pressure. In addition, the electronic apparatus EA may sense a proximity input as well as an input touched to the electronic apparatus EA.

In the present embodiment, a user's hand applied to the front surface FS is illustrated as an example of the user's input TC. However, embodiments of the inventive concepts are not limited thereto. In other words, the user's input TC may be provided in various forms, as described above. In certain embodiments, the electronic apparatus EA may also sense the user's input TC applied to a side surface and/or a rear surface of the electronic apparatus EA, on the basis of a structure of the electronic apparatus EA.

The electronic apparatus EA may include a window 100, an electronic panel 200, a circuit board 300, an electronic module 400, and an outer case 500. The window 100 and the outer case 500 may be coupled to each other to form the exterior of the electronic apparatus EA.

The window 100 may be disposed on the electronic panel 200 to cover a front surface IS of the electronic panel 200. The window 100 may include an optically transparent insulating material. For example, the window 100 may include glass or plastic. The window 100 may have a single-layered or multi-layered structure. For example, the window 100 may have a stack structure including a plurality of plastic films coupled to each other by an adhesive or may have a stack structure that includes a glass substrate and a plastic film coupled to each other by an adhesive.

The window 100 may include a front surface FS exposed to the outside. The front surface FS of the electronic apparatus EA may be substantially defined by the front surface FS of the window 100.

The transmission area TA may be optically transparent. The transmission area TA may have a shape corresponding to a shape of an active area AA. For example, the transmission area TA may overlap with the whole or at least a portion of the active area AA. The image IM displayed in the active area AA of the electronic panel 200 may be visible to the outside through the transmission area TA.

A light transmittance of the bezel area BZA may be less than a light transmittance of the transmission area TA. The bezel area BZA may define a shape of the transmission area TA. The bezel area BZA may be adjacent to the transmission area TA and may surround or partially surround the transmission area TA in a plan view.

The bezel area BZA may have any suitable color (e.g., a predetermined color). When the window 100 includes a glass or plastic substrate, the bezel area BZA may have a color layer printed or deposited on a surface of the glass or plastic substrate. Alternatively, the bezel area BZA may be formed by coloring a corresponding area of the glass or plastic substrate.

The bezel area BZA may cover a peripheral area NAA of the electronic panel 200 to prevent the peripheral area NAA from being visible to the outside. However, embodiments of the inventive concepts are not limited thereto. In another embodiment of the inventive concepts, the bezel area BZA may be omitted in the window 100.

The electronic panel 200 may display the image IM and may sense an external input TC (e.g., the user's input TC). The electronic panel 200 may include the front surface IS that includes the active area AA and the peripheral area NAA. The active area AA may be an area that is activated by an electrical signal.

In the present embodiment, the active area AA may be an area in which the image IM is displayed and may also be an area in which the external input TC is sensed. The transmission area TA may overlap with at least the active area AA. For example, the transmission area TA may overlap with the whole (i.e., the entirety of) or at least a portion of the active area AA. Thus, a user may view the image IM through the transmission area TA and/or may provide the external input TC through the transmission area TA. However, embodiments of the inventive concepts are not limited thereto. In another embodiment, an area for displaying the image IM and an area for sensing the external input TC may be separated from each other in the active area AA.

The peripheral area NAA may be covered by the bezel area BZA. The peripheral area NAA may be adjacent to the active area AA. The peripheral area NAA may surround or partially surround the active area AA when viewed in a plan view. A driving circuit and/or driving lines for driving the active area AA may be disposed in the peripheral area NAA.

Various signal lines, pads PD and/or electronic components for providing electrical signals to the active area AA may be disposed in the peripheral area NAA. The peripheral area NAA may be covered by the bezel area BZA and thus may not be visible to the outside.

In the present embodiment, the electronic panel 200 may be assembled in a flat state where the active area AA and the peripheral area NAA face the window 100. However, embodiments of the inventive concepts are not limited thereto. In another embodiment, a portion of the peripheral area NAA of the electronic panel 200 may be bent. In this case, a portion of the peripheral area NAA may face the rear surface of the electronic apparatus EA, and thus the bezel area BZA in the front surface of the electronic apparatus EA may be reduced. In still another embodiment, the electronic panel 200 may be assembled in a state where a portion of the active area AA is also bent. In yet another embodiment, the peripheral area NAA may be omitted in the electronic panel 200.

Referring to FIG. 2, the electronic panel 200 may include a display unit 210 and a sensing unit 220. The display unit 210 may be a component that substantially generates the image IM. The image IM generated from the display unit 210 may be visible to a user through the transmission area TA.

The sensing unit 220 may sense the external input TC applied from the outside. As described above, the sensing unit 220 may sense the external input TC provided to the window 100.

A hole area HA (or a first area) may be defined in the electronic panel 200. A transmittance per unit area of the hole area HA may be higher than a transmittance per unit area of the active area AA (or a second area). The hole area HA may be defined at a position overlapping with the electronic module 400 in a plan view.

At least a portion of the hole area HA may be surrounded by the active area AA when viewed in a plan view. In the present embodiment, the hole area HA may be spaced apart from the peripheral area NAA (or a third area). In FIG. 1B, the hole area HA is defined in the active area AA such that an entire edge of the hole area HA is surrounded by the active area AA.

The electronic panel 200 may include a hole MH that is defined in the hole area HA and penetrates the electronic panel 200. The hole MH may penetrate at least one of the display unit 210 or the sensing unit 220. The edge of the hole area HA may be spaced apart from an edge of the hole MH (e.g., spaced apart by a predetermined distance) and may extend along the edge of the hole MH. The edge of the hole area HA may have a shape corresponding to a shape of the edge of the hole MH.

The circuit board 300 may be connected to the electronic panel 200. The circuit board 300 may include a flexible board CF and a main board MB. The flexible board CF may include an insulating film and conductive lines mounted on the insulating film. The conductive lines may be connected to the pads PD and thus may electrically connect the circuit board 300 and the electronic panel 200.

In the present embodiment, the flexible board CF may be assembled in a bent state. Thus, the main board MB may be disposed on a rear surface of the electronic panel 200 and may be stably located in a space provided by the outer case 500. In another embodiment, the flexible board CF may be omitted. In this case, the main board MB may be connected directly to the electronic panel 200.

The main board MB may include signal lines and electronic components. The electronic components may be electrically connected to the electronic panel 200 through the signal lines. The electronic components may generate various kinds of electrical signals (e.g., a signal for generating the image IM and/or a signal for sensing the external input TC) and/or may process a sensed signal. The main board MB may be provided in plurality to correspond to the electrical signals for the generation and the process, respectively.

In the electronic apparatus EA according to an embodiment of the inventive concepts, a driving circuit for providing electrical signals to the active area AA may be mounted directly on the electronic panel 200. In this case, the driving circuit may be mounted in a chip form or may be formed together with pixels PX. In this case, an area (or size) of the circuit board 300 may be reduced or the circuit board 300 may be omitted. In certain embodiments, the electronic apparatus EA may be variously embodied and may not be limited to one embodiment.

The electronic module 400 may be disposed under the window 100. The electronic module 400 may overlap with the hole MH and the hole area HA when viewed in a plan view (e.g., in a direction normal to the front surface FS). The electronic module 400 may receive an external input transferred through the hole area HA and/or may provide an output signal through the hole area HA.

A receiving part for receiving the external input and/or an output part for providing the output signal in the electronic module 400 may overlap with the hole area HA when viewed in a plan view (e.g., in a direction normal to the front surface FS). The whole or a portion of the electronic module 400 may be received in the hole area HA or the hole MH. According to the embodiment of the inventive concepts, because the electronic module 400 overlaps with the active area AA, an increase in the bezel area BZA may be prevented.

Referring to FIG. 2, the electronic apparatus EA may include the electronic panel 200, a power supply module PM, a first electronic module EM1, and a second electronic module EM2. The electronic panel 200, the power supply module PM, the first electronic module EM1 and the second electronic module EM2 may be electrically connected to each other. The display unit 210 and the sensing unit 220 may be components of the electronic panel 200, and are illustrated in FIG. 2.

The first electronic module EM1 and the second electronic module EM2 may include various functional modules for operating the electronic apparatus EA. The first electronic module EM1 may be mounted directly on a motherboard electrically connected to the electronic panel 200. Alternatively, the first electronic module EM1 may be mounted on an additional board so as to be electrically connected to the motherboard through a connector.

The first electronic module EM1 may include a control module CM, a wireless communication module TM, an image input module IIM, a sound input module AIM, a memory MM, and an external interface IF. In an embodiment, some of the components (i.e., the modules) may not be mounted on the motherboard but may be electrically connected to the motherboard through a flexible circuit board.

The control module CM may control overall operations of the electronic apparatus EA. The control module CM may include a microprocessor. For example, the control module CM may activate or deactivate the electronic panel 200. The control module CM may control other module(s) (e.g., the image input module IIM, the sound input module AIM, etc.) on the basis of an external input (e.g., a touch signal) received from the electronic panel 200.

The wireless communication module TM may transmit/receive a wireless signal to/from other terminal(s) by using Bluetooth or Wi-Fi. The wireless communication module TM may transmit/receive a voice signal by using a general communication line. The wireless communication module TM may include a transmitter TM1 that is configured to modulate a signal to be transmitted and to transmit the modulated signal, and a receiver TM2 that is configured to demodulate a received signal.

The image input module IIM may process image signals to convert the image signals into image data usable in the electronic panel 200. The sound input module AIM may receive an external sound signal through a microphone in a recording mode or a voice recognition mode and may convert the received sound signal into electrical sound data.

The external interface IF may be connected to and interface with an external charger, a cable/wireless data port, and/or a card socket (e.g., a memory card or a SIM/UIM card).

The second electronic module EM2 may include a sound output module AOM, a light emitting module LM, a light receiving module LRM, and a camera module CMM. The components of the second electronic module EM2 may be mounted directly on the motherboard or may be mounted on an additional board so as to be electrically connected to the electronic panel 200 and/or the first electronic module EM1 through a connector (not shown).

The sound output module AOM may convert sound data received from the wireless communication module TM and/or sound data stored in the memory MM and may output the converted sound data to the outside.

The light emitting module LM may generate light and may output the generated light. The light emitting module LM may output infrared light. For example, the light emitting module LM may include a light emitting diode (LED) element. For example, the light receiving module LRM may sense infrared light. The light receiving module LRM may be activated when sensing the infrared light of a reference level (e.g., a predetermined level) or more. The light receiving module LRM may include a CMOS sensor. After the infrared light generated by the light emitting module LM is outputted, the infrared light may be reflected by an external object (e.g., a user's finger or face), and the reflected infrared light may be incident to the light receiving module LRM. The camera module CMM may acquire an external image.

The electronic module 400 according to some embodiments of the inventive concepts may include at least one of the components of the first and second electronic modules EM1 and EM2. For example, the electronic module 400 may include at least one of the camera, the speaker, the light sensing sensor, or the heat sensing sensor. The electronic module 400 may sense an external object through the hole area HA and/or may provide a sound signal (e.g., a voice) to the outside through the hole area HA. In certain embodiments, the electronic module 400 may include a plurality of components. However, the inventive concepts are not limited to a specific embodiment.

The electronic module 400 overlapping with the hole area HA may easily recognize an external object through the hole area HA and/or may easily transmit an output signal generated from the electronic module 400 to the outside. Although not shown in the drawings, the electronic apparatus EA according to an embodiment may further include a transparent member disposed between the electronic module 400 and the electronic panel 200. The transparent member may be an optically transparent film such that the external input provided through the hole MH is transmitted to the electronic module 400 through the transparent member. The transparent member may be adhered to the rear surface of the electronic panel 200 or may be disposed between the electronic panel 200 and the electronic module 400 without an additional adhesive layer. In certain embodiments, the structure of the electronic apparatus EA may be variously modified or changed and may not be limited to one embodiment.

According to the embodiment of the inventive concepts, the electronic module 400 may overlap with the transmission area TA when viewed in a plan view (e.g., in a direction normal to the front surface FS). As a result, an increase in the bezel area BZA by reception of the electronic module 400 may be prevented, and thus the aesthetics of the electronic apparatus EA may be improved.

Figure 3A:
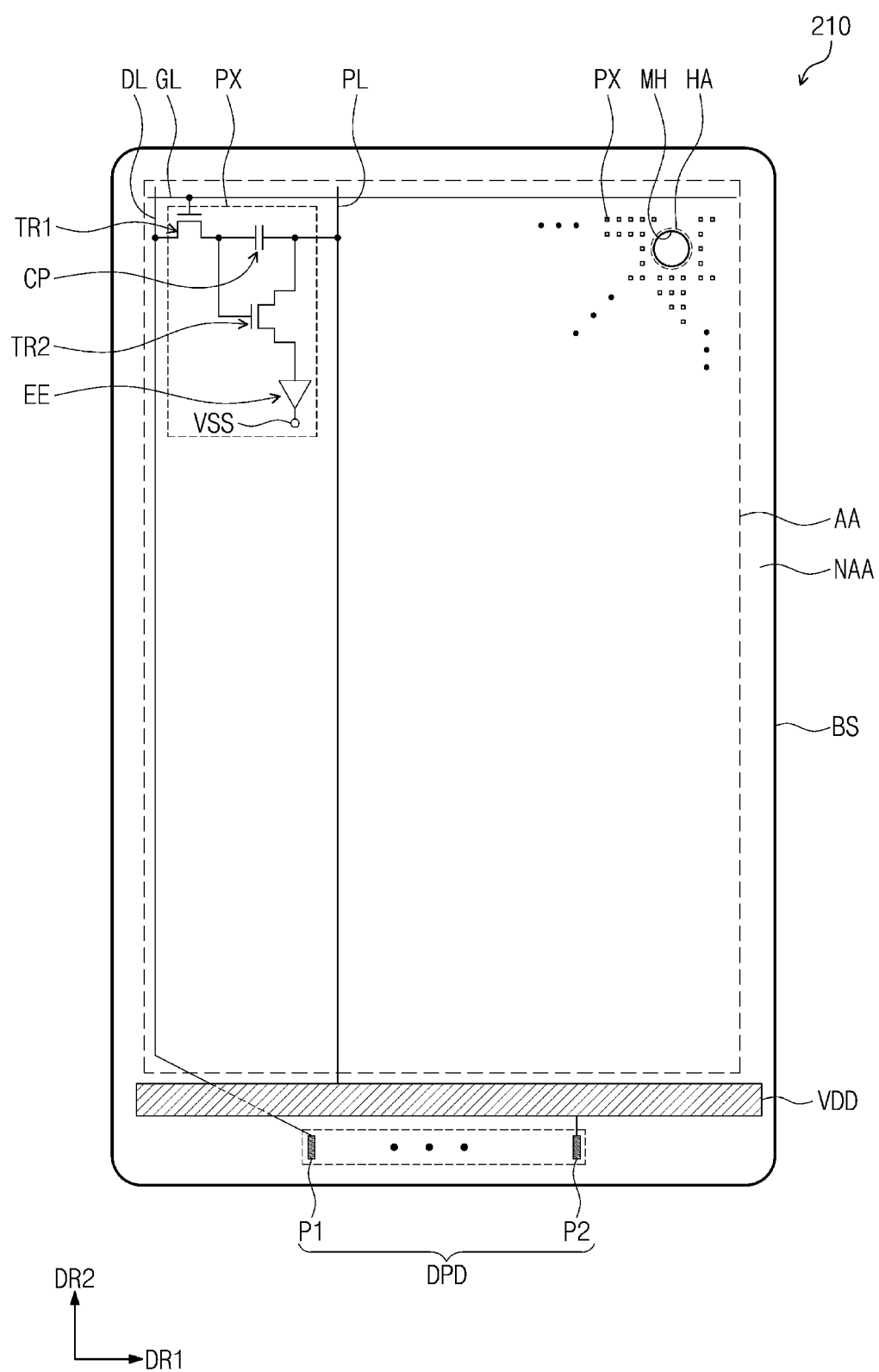
FIG. 3A is a plan view illustrating a display unit according to an embodiment of the inventive concepts.
Figure 3B:
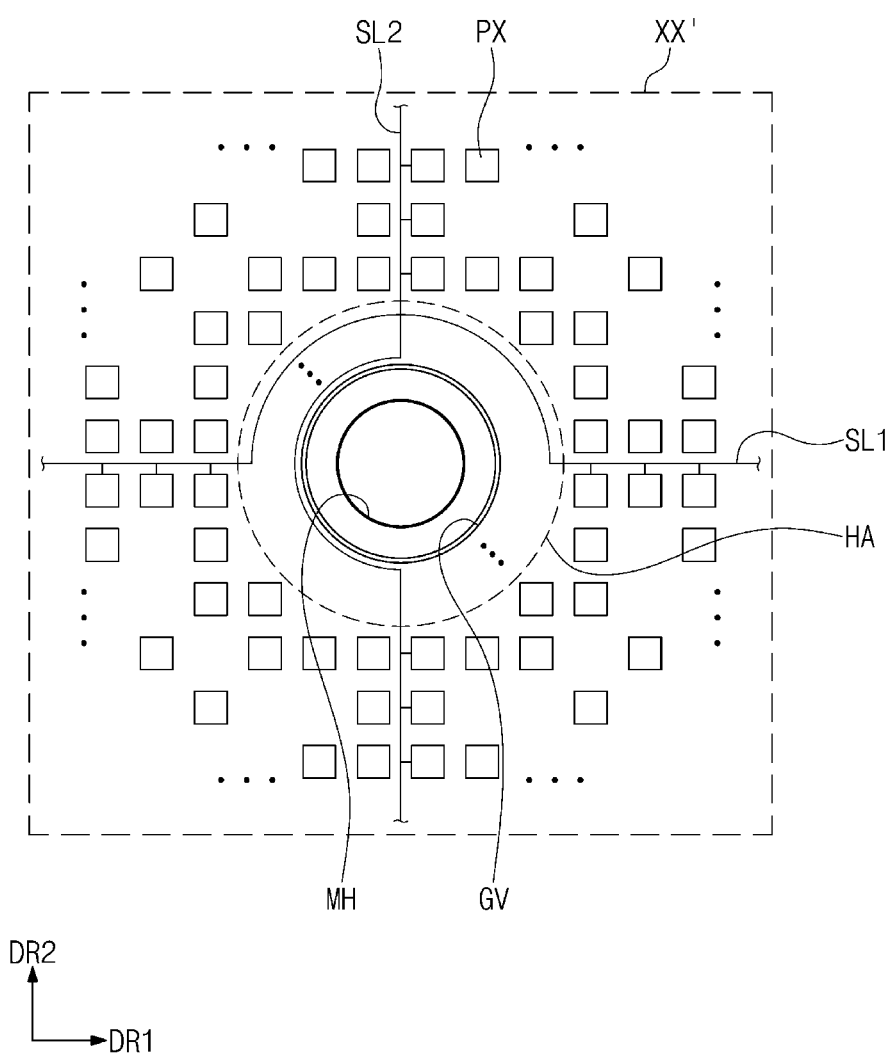
FIG. 3B is an enlarged view of a portion of FIG. 3A.
Figure 3C:
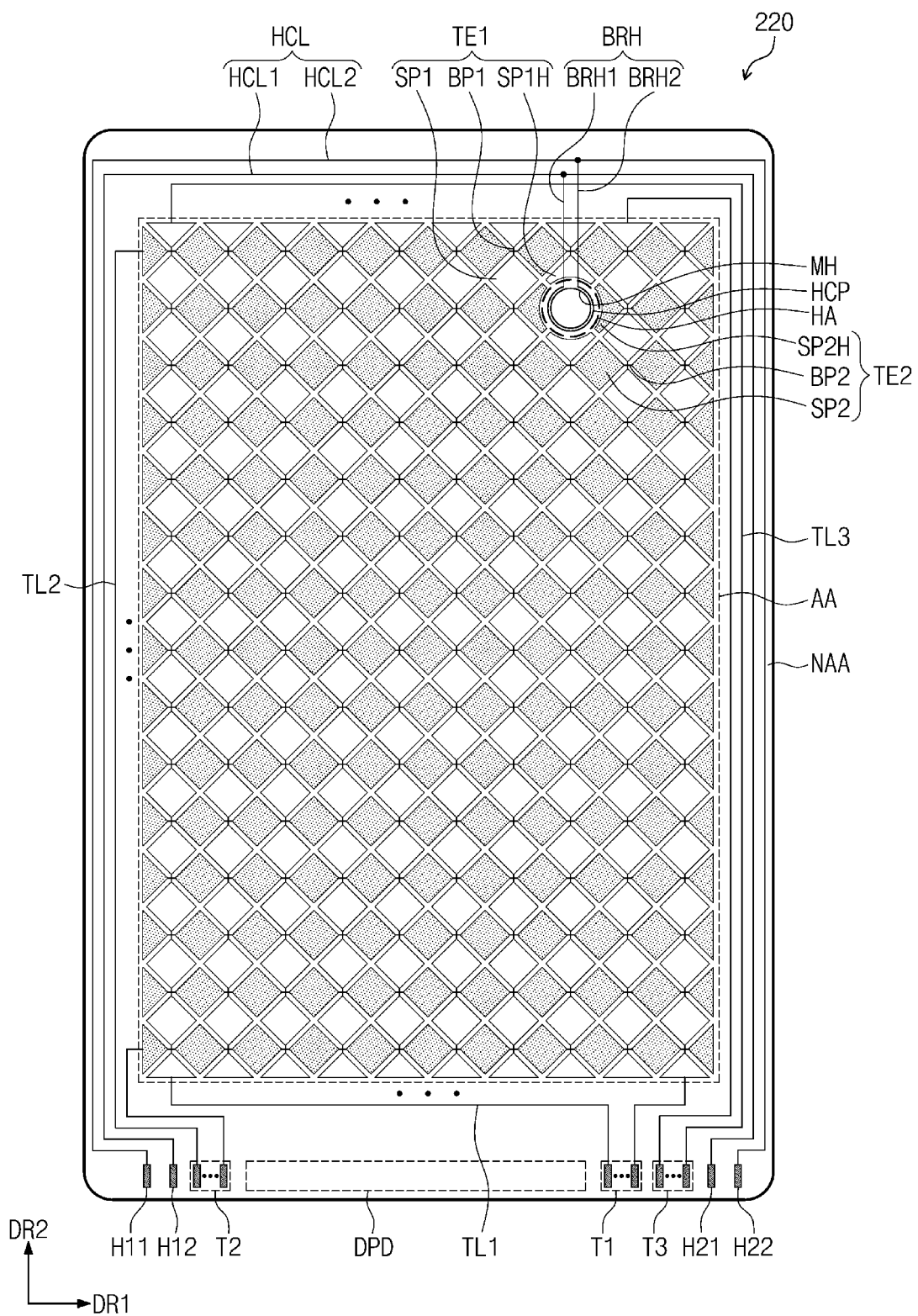
FIG. 3C is a plan view illustrating a sensing unit according to an embodiment of the inventive concepts.
Figure 4:
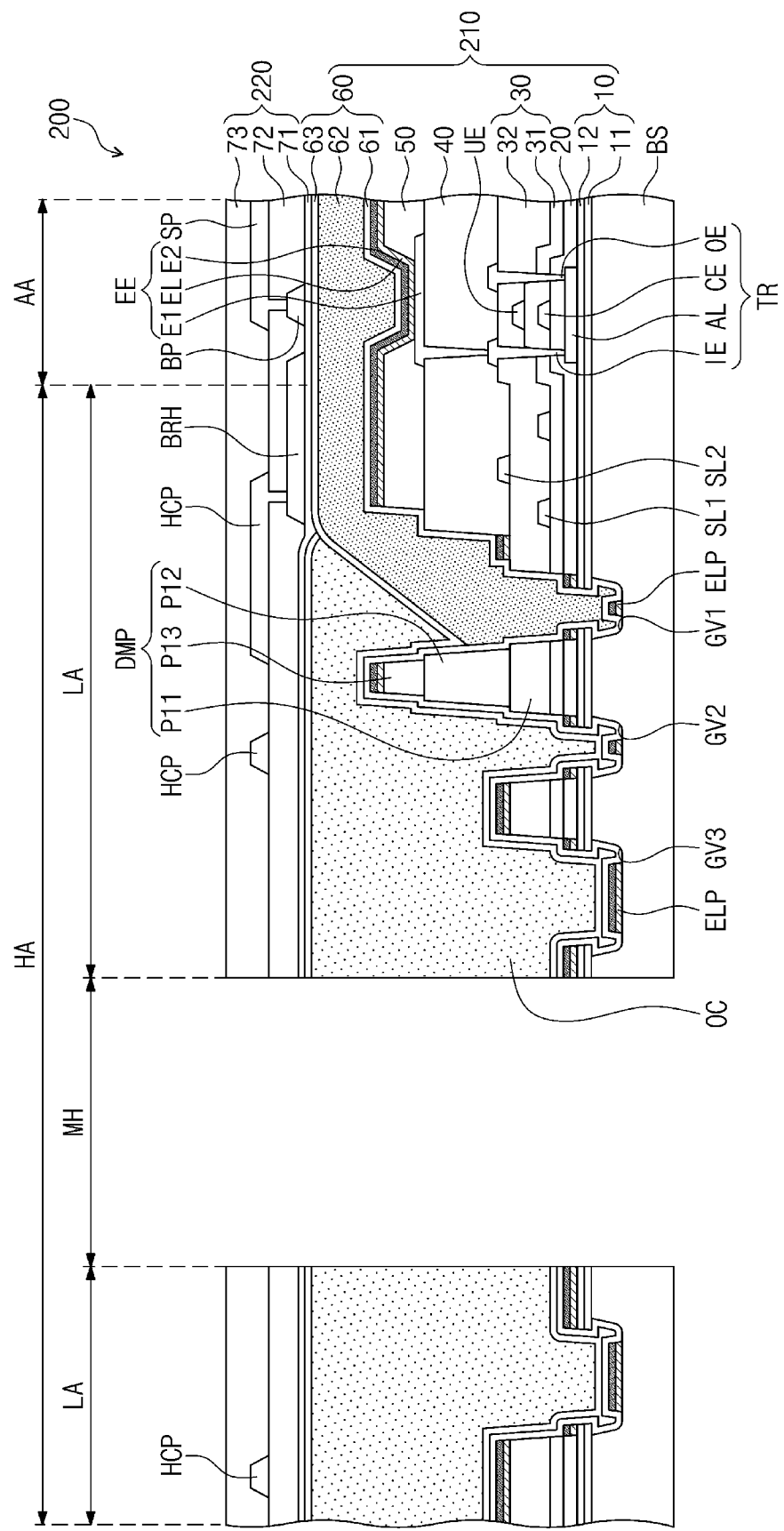
FIG. 4 is a cross-sectional view illustrating a portion of an electronic panel according to an embodiment of the inventive concepts.

FIG. 3A is a plan view illustrating a display unit according to an embodiment of the inventive concepts. FIG. 3B is an enlarged view of a portion of FIG. 3A. FIG. 3C is a plan view illustrating a sensing unit according to an embodiment of the inventive concepts. FIG. 4 is a cross-sectional view illustrating a portion of an electronic panel according to an embodiment of the inventive concepts.

FIG. 3A schematically illustrates a signal circuit diagram, and FIG. 3B is an enlarged view of an area XX' of FIG. 1B. For the purpose of ease and convenience in description and illustration, some components are omitted in FIGS. 3A-4. Hereinafter, an embodiment of the inventive concepts will be described with reference to FIGS. 3A-4.

As illustrated in FIG. 3A, the display unit 210 may include a base substrate BS, a plurality of pixels PX, a plurality of signal lines GL, DL and PL, and a plurality of display pads DPD.

The active area AA and the peripheral area NAA may be areas provided by the base substrate BS. The base substrate BS may include an insulating substrate. For example, the base substrate BS may include a glass substrate, a plastic substrate, or a combination thereof.

The signal lines GL, DL and PL may be connected to the pixels PX and may transmit electrical signals to the pixels PX. A scan line GL, a data line DL, and a power line PL of the signal lines that are included in the display unit 210 are illustrated as an example in FIG. 3A. However, embodiments of the inventive concepts are not limited thereto. In certain embodiments, the signal lines GL, DL and PL may further include at least one of a power supply line, an initialization voltage line, or an emission control line.

The pixels PX may be disposed in the active area AA. In the present embodiment, an enlarged circuit diagram of one of the pixels PX is illustrated as an example in FIG. 3A. The pixel PX may include a first thin film transistor TR1, a capacitor CP, a second thin film transistor TR2, and a light emitting element EE. The first thin film transistor TR1 may be a switching element configured to control on/off of the pixel PX. The first thin film transistor TR1 may transmit or block a data signal provided through the data line DL in response to a scan signal provided through the scan line GL.

The capacitor CP may be connected to the first thin film transistor TR1 and the power line PL. The capacitor CP may be charged with a charge (e.g., voltage) corresponding to a difference between the data signal transmitted from the first thin film transistor TR1 and a first power source signal provided through the power line PL.

The second thin film transistor TR2 may be connected to the first thin film transistor TR1, the capacitor CP, and the light emitting element EE. The second thin film transistor TR2 may control a driving current, flowing through the light emitting element EE, in response to the amount of charge (e.g., voltage) stored in the capacitor CP. A turn-on time of the second thin film transistor TR2 may be determined depending on the amount of the charge (e.g., voltage) stored in the capacitor CP. The second thin film transistor TR2 may provide the first power source signal transmitted through the power line PL to the light emitting element EE for the turn-on time.

The light emitting element EE may generate light or control the amount of light according to an electrical signal. For example, the light emitting element EE may include an organic light emitting element, a quantum dot light emitting element, an electrophoretic element, an electrowetting element, or any other suitable element.

The light emitting element EE may be connected to a power source terminal VSS and may receive a power source signal (hereinafter, referred to as a second power source signal) different from the first power source signal provided from the power line PL. The driving current corresponding to a difference between the second power source signal and the electrical signal provided from the second thin film transistor TR2 may flow through the light emitting element EE, and the light emitting element EE may generate light corresponding to the driving current. However, embodiments of the inventive concepts are not limited thereto. The components of each of the pixels PX may be variously modified or changed and may be variously arranged in any suitable manner.

The pixels PX may be disposed around the hole MH and may be disposed to surround or partially surround the hole MH in a plan view (e.g., a direction parallel to the front surface FS). In FIG. 3B, the hole area HA is illustrated by a dotted line for the purpose of ease and convenience in description and illustration. The area XX' includes an area in which the hole MH is defined. Hereinafter, an area of the display unit 210 in which the hole MH is disposed will be described with reference to FIG. 3B.

As described above, the hole MH may be defined in the active area AA. Thus, some of the pixels PX may be disposed adjacent to the hole MH. Some of the pixels PX may surround or partially surround the hole MH when viewed in a plan view.

A recess pattern GV may be defined in the hole area HA. The recess pattern GV may extend along the edge of the hole MH in a plan view (e.g., in a direction normal to the front surface FS) and may have a circular ring shape surrounding the hole MH in the present embodiment. However, embodiments of the inventive concepts are not limited thereto. In other embodiments, the recess pattern GV may have a different shape from that of the hole MH. For example, the recess pattern GV may have a polygonal shape, an elliptical shape, or a closed loop shape of which at least a portion is curved. Alternatively, the recess pattern GV may have a shape including a plurality of patterns separated from each other.

The recess pattern GV may correspond to a portion recessed from the front surface of the display unit 210 and may block a path of moisture and/or oxygen permeating to the pixels PX through the hole MH. This will be described later in more detail.

A plurality of signal lines SL1 and SL2 connected to the pixels PX may be disposed in the hole area HA. The signal lines SL1 and SL2 may be connected to the pixels PX via the hole area HA. A first signal line SL1 and a second signal line SL2 of the plurality of signal lines connected to the pixels PX are illustrated as an example in FIG. 3B for the purpose of ease and convenience in description.

The first signal line SL1 may extend in the first direction DR1. The first signal line SL1 may be connected to the pixels PX which are arranged along the first direction DR1 to constitute a same row. For example, the first signal line SL1 may correspond to the scan line GL.

Some of the pixels PX connected to the first signal line SL1 may be disposed at a left side of the hole MH, and others thereof may be disposed at a right side of the hole MH. Thus, the pixels PX in the same row connected to the first signal line SL1 may be turned on/off by substantially the same scan signal even though one or more pixels in the same row are omitted due to the hole MH.

The second signal line SL2 may extend in the second direction DR2. The second signal line SL2 may be connected to the pixels PX which are arranged in the second direction DR2 to constitute a same column. For example, the second signal line SL2 may correspond to the data line DL.

Some of the pixels PX connected to the second signal line SL2 may be disposed at a top side of the hole MH, and others thereof may be disposed at a bottom side of the hole MH. Thus, the pixels PX in the same column connected to the second signal line SL2 may receive the data signal through the same line even though one or more pixels in the same column are omitted due to the hole MH.

In certain embodiments, the electronic panel 200 may further include a connecting pattern disposed in the hole area HA. In this case, the first signal line SL1 overlapping with the hole area HA may be cut. The cut portions of the first signal line SL1 may be connected to each other through the connecting pattern. Likewise, the second signal line SL2 overlapping with the hole area HA may be cut, and the cut portions of the second signal line SL2 may be connected to each other through the connecting pattern.

Referring again to FIG. 3A, a power pattern VDD may be disposed in the peripheral area NAA. In the present embodiment, the power pattern VDD may be connected to a plurality of the power lines PL. Because the display unit 210 includes the power pattern VDD, the same first power source signal may be provided to the plurality of pixels PX.

The display pads DPD may include a first pad P1 and a second pad P2. The first pad P1 may be provided in plurality, and the plurality of first pads P1 may be connected to the data lines DL, respectively. The second pad P2 may be connected to the power pattern VDD and thus may be electrically connected to the power lines PL. The display unit 210 may provide electrical signals received from the outside (e.g., an external device) through the display pads DPD to the pixels PX. In an embodiment, the display pads DPD may further include pads for receiving other electrical signals in addition to the first pad P1 and the second pad P2. However, the inventive concepts are not limited to one embodiment.

Referring to FIG. 3C, the sensing unit 220 may be disposed on the display unit 210. The sensing unit 220 may sense the external input TC (see FIG. 1A) to obtain information on a position and/or strength of the external input TC. The sensing unit 220 may include a plurality of first sensing electrodes TE1, a plurality of second sensing electrodes TE2, a plurality of sensing lines TL1, TL2 and TL3, and a plurality of sensing pads T1, T2 and T3.

The first sensing electrodes TE1 and the second sensing electrodes TE2 may be disposed in the active area AA. The sensing unit 220 may obtain information on the external input TC by using a change in capacitance between the first sensing electrodes TE1 and the second sensing electrodes TE2.

The first sensing electrodes TE1 may be arranged in the first direction DR1 and may extend in the second direction DR2. Each of the first sensing electrodes TE1 may include a first main pattern SP1 and a first connection pattern BP1. In an embodiment, the first sensing electrode TE1 adjacent to the hole area HA may further include a first adjacent pattern SP1H.

The first main pattern SP1 may be disposed in the active area AA. The first main pattern SP1 may be spaced apart from the hole MH. The first main pattern SP1 may have a suitable shape (e.g., predetermined shape) and may have a first area (or first size). In the present embodiment, the first main pattern SP1 may have a diamond or lozenge shape. However, embodiments of the inventive concepts are not limited thereto. In other embodiments, the shape of the first main pattern SP1 may be variously modified.

The first adjacent pattern SP1H may be adjacent to the hole area HA. The first adjacent pattern SP1H may have a second area (or second size) less than the first area of the first main pattern SP1. The first adjacent pattern SP1H may have a shape obtained by removing a portion overlapping with the hole area HA from the same shape (e.g., the diamond shape) as the first main pattern SP1.

In the present embodiment, the first connection pattern BP1 may extend in the second direction DR2. The first connection pattern BP1 may be connected to the first main pattern SP1. The first connection pattern BP1 may be disposed between two first main patterns SP1 to connect the two first main patterns SP1. In an embodiment, the first connection pattern BP1 may be disposed between the first main pattern SP1 and the first adjacent pattern SP1H to connect the first main pattern SP1 and the first adjacent pattern SP1H.

The second sensing electrodes TE2 may be arranged in the second direction DR2 and may extend in the first direction DR1. Each of the second sensing electrodes TE2 may include a second main pattern SP2 and a second connection pattern BP2. In an embodiment, the second sensing electrode TE2 adjacent to the hole area HA may further include a second adjacent pattern SP2H.

The second main pattern SP2 may be spaced apart from the hole MH. The second main pattern SP2 may be spaced apart from the first main pattern SP1. In the present embodiment, the first main pattern SP1 and the second main pattern SP2 may be spaced apart from each other when viewed in a cross-sectional view. The first main pattern SP1 and the second main pattern SP2 may not be in contact with each other and thus may transmit/receive independent electrical signals.

In the present embodiment, the second main pattern SP2 may have the same shape as the first main pattern SP1. For example, the second main pattern SP2 may have a diamond or lozenge shape. However, embodiments of the inventive concepts are not limited thereto. In other embodiments, the shape of the second main pattern SP2 may be variously modified in a suitable manner.

The second adjacent pattern SP2H may be adjacent to the hole MH. The second adjacent pattern SP2H may have an area (or size) less than an area (or size) of the second main pattern SP2. The second adjacent pattern SP2H may have a shape obtained by removing a portion overlapping with the hole MH or the hole area HA from the same shape (e.g., the same diamond shape) as the second main pattern SP2.

In the present embodiment, the second connection pattern BP2 may extend in the first direction DR1. The second connection pattern BP2 may be connected to the second main pattern SP2. The second connection pattern BP2 may be disposed between two second main patterns SP2 to connect the two second main patterns SP2. In an embodiment, the second connection pattern BP2 may be disposed between the second main pattern SP2 and the second adjacent pattern SP2H to connect the second main pattern SP2 and the second adjacent pattern SP2H.

The sensing lines TL1, TL2 and TL3 may be disposed in the peripheral area NAA. The sensing lines TL1, TL2 and TL3 may include first sensing lines TL1, second sensing lines TL2, and third sensing lines TL3.

The first sensing lines TL1 are connected to the first sensing electrodes TE1, respectively. In the present embodiment, the first sensing lines TL1 may be connected to bottom ends of the first sensing electrodes TE1, respectively, when viewed in a plan view (e.g., in a direction normal to the front surface FS with the hole MH located at the top right of the electronic apparatus EA as depicted in FIG. 3C).

Each of the second sensing lines TL2 are connected to a first end of each of the second sensing electrodes TE2. In the present embodiment, the second sensing lines TL2 may be connected to a second end each of the second sensing electrodes TE2, respectively.

The third sensing lines TL3 are connected to top ends of the first sensing electrodes TE1, respectively, when viewed in a plan view (e.g., in a direction normal to the front surface FS as depicted in FIG. 3C). According to the embodiments of the inventive concepts, the first sensing electrodes TE1 may be connected to the first sensing lines TL1 and the third sensing lines TL3, respectively. Thus, sensitivity of the first sensing electrodes TE1, which extend longer than the second sensing electrodes TE2, may be uniformly maintained. However, embodiments of the inventive concepts are not limited thereto. In another embodiment, the third sensing lines TL3 may be omitted in the sensing unit 220.

The sensing pads T1, T2 and T3 may be disposed in the peripheral area NAA. The sensing pads T1, T2 and T3 may include first sensing pads T1, second sensing pads T2, and third sensing pads T3. The first sensing pads T1 may be connected to the first sensing lines TL1, respectively, to provide external signals to the first sensing electrodes TE1. The second sensing pads T2 may be connected to the second sensing lines TL2, respectively, and may be electrically connected to the second sensing electrodes TE2, respectively. The third sensing pads T3 may be connected to the third sensing lines TL3, respectively.

In an embodiment of the inventive concepts, the sensing unit 220 may further include a crack detecting circuit HCC (which is depicted in FIGS. 5B, 6A-6C, and 7B). The crack detecting circuit HCC may receive an electrical signal independent of the first sensing electrodes TE1 and the second sensing electrodes TE2. The crack detecting circuit HCC may include a crack detecting pattern HCP, a crack detecting line HCL and a connection line BRH, which are connected to each other.

The crack detecting pattern HCP may be disposed in the hole area HA. The crack detecting pattern HCP may extend along the edge of the hole area HA in the hole area HA. In the present embodiment, the crack detecting pattern HCP may have a shape surrounding the edge of the hole MH.

The crack detecting pattern HCP may include a conductive material (e.g., the crack detecting pattern HCP may have conductivity). In the present embodiment, the crack detecting pattern HCP may have a single unitary body shape.

The crack detecting line HCL may be disposed in the peripheral area NAA. In the present embodiment, the crack detecting line HCL may be disposed outside the first to third sensing lines TL1, TL2 and TL3 when viewed in a plan view (e.g., from a direction normal to the front surface FS).

The crack detecting line HCL may be electrically connected to the crack detecting pattern HCP. The crack detecting line HCL may include a first line HCL1 and a second line HCL2, which are spaced apart from each other.

Each of the first line HCL1 and the second line HCL2 may be connected to corresponding ones of first to fourth pads H11, H12, H21 and H22. For example, a first end of the first line HCL1 may be connected to the second pad H12, and a first end of the second line HCL2 may be connected to the first pad H11. For example, the first pad H11 and the second pad H12 may be disposed at a left side of the area in which the display pads DPD are disposed.

For example, a second end of the first line HCL1 may be connected to the third pad H21, and a second end of the second line HCL2 may be connected to the fourth pad H22. For example, the third pad H21 and the fourth pad H22 may be disposed at a right side of the area in which the display pads DPD are disposed. The first and second pads H11 and H12 may be spaced apart from the third and fourth pads H21 and H22 with the display pads DPD interposed therebetween.

According to an embodiment of the inventive concepts, the crack detecting circuit HCC may be used to check or determine whether damage (e.g., a crack) has occurred in the hole area HA and/or the peripheral area NAA. In the crack detecting circuit HCC, the first pad H11 and the third pad H21 may be input terminals, and the second pad H12 and the fourth pad H22 may be output terminals.

An electrical signal received through the first pad H11 may pass through the crack detecting pattern HCP via the second line HCL2. Thereafter, the electrical signal outputted from the crack detecting pattern HCP may be outputted to the second pad H12 via the first line HCL1.

Likewise, an electrical signal received through the third pad H21 may pass through the crack detecting pattern HCP via the first line HCL1. Thereafter, the electrical signal outputted from the crack detecting pattern HCP may be outputted to the fourth pad H22 via the second line HCL2.

For example, when a level of a signal sensed from each of the second and fourth pads H12 and H22 is lower than a level of a reference signal or is zero (e.g., a poor signal), the first and second lines HCL1 and HCL2 may be damaged or the crack detecting pattern HCP may be damaged. Thus, it is possible to check or determine whether a crack has occurred in the hole area HA or not.

When only a signal received from one of the second and fourth pads H12 and H22 is not a poor signal, the crack detecting line HCL may be damaged. Thus, it is possible to check or determine whether a crack has occurred in the peripheral area NAA or not. However, embodiments of the inventive concepts are not limited thereto. In certain embodiments, the first and third pads H11 and H21 may function as the output terminals, and the second and fourth pads H12 and H22 may function as input terminals.

The connection line BRH may include a first connection line BRH1 and a second connection line BRH2. The first connection line BRH1 may connect the first line HCL1 and the crack detecting pattern HCP. The second connection line BRH2 may connect the second line HCL2 and the crack detecting pattern HCP.

In the present embodiment, the connection line BRH may be spaced apart from an overlapping pattern of the first sensing electrode TE1 or the second sensing electrode TE2 when viewed in a cross-sectional view or may be spaced apart from the first sensing electrode TE1 or the second sensing electrode TE2 when viewed in a plan view (e.g., viewed from a direction normal to the front surface FS as depicted in FIG. 3C). Thus, the connection line BRH may be electrically insulated from the first sensing electrode TE1 or the second sensing electrode TE2. This will be described later in more detail.

According to the embodiment of the inventive concepts, the sensing unit 220 may further include the crack detecting circuit HCC, and thus it is possible to sense or determine whether a defect (e.g., a crack) has occurred in the sensing unit 220 (in particular, the hole area HA) or not. As a result, reliability of the electronic apparatus EA may be improved, and a defect of the electronic apparatus EA may be checked or determined without a separate inspection circuit or device, thereby increasing process efficiency.

FIG. 4 is a cross-sectional view illustrating a portion of an electronic panel according to an embodiment of the inventive concepts. Hereinafter, an embodiment of the inventive concepts will be described with reference to FIG. 4. Meanwhile, the same components as described with reference to FIGS. 1A-3C may be indicated by the same reference numerals or designators, and the descriptions thereto may be omitted for the purpose of ease and convenience in description.

As illustrated in FIG. 4, the display unit 210 and the sensing unit 220 may be stacked in the third direction DR3 in the electronic panel 200. The display unit 210 may include the base substrate BS, the pixel PX (e.g., the pixel PX of FIG. 3A), a plurality of insulating layers 10, 20, 30, 40 and 50, and an encapsulation layer 60.

As described above, the base substrate BS may be an insulating substrate. For example, the base substrate BS may include a plastic substrate or a glass substrate.

In the present embodiment, the second thin film transistor (hereinafter, referred to as a thin film transistor TR) and the light emitting element EE of the pixel PX depicted in the circuit diagram of FIG. 3A are illustrated as an example in FIG. 4. The insulating layers 10, 20, 30, 40 and 50 may include first to fifth insulating layers 10, 20, 30, 40 and 50 sequentially stacked. Each of the first to fifth insulating layers 10, 20, 30, 40 and 50 may include an organic material and/or an inorganic material and may have a single-layered or multi-layered structure.

The first insulating layer 10 may be disposed on the base substrate BS and cover a front surface of the base substrate BS. The first insulating layer 10 may include a barrier layer 11 and/or a buffer layer 12. Thus, the first insulating layer 10 may substantially prevent oxygen and/or moisture from permeating into the pixel PX through the base substrate BS and/or may reduce surface energy of the base substrate BS such that the pixel PX is stably formed on the base substrate BS.

However, embodiments of the inventive concepts are not limited thereto. In other embodiments, at least one of the barrier layer 11 or the buffer layer 12 may be omitted or may have a plurality of stacked layers.

The thin film transistor TR may be disposed on the first insulating layer 10. The thin film transistor TR may include a semiconductor pattern AL, a control electrode CE, an input electrode IE, and an output electrode OE. The semiconductor pattern AL may be disposed on the first insulating layer 10. The semiconductor pattern AL may include a semiconductor material. The control electrode CE may be spaced apart from the semiconductor pattern AL with the second insulating layer 20 interposed therebetween. The control electrode CE may be connected to the first thin film transistor TR1 (see FIG. 3A) and a first electrode of the capacitor CP (see FIG. 3A).

The input electrode IE and the output electrode OE may be disposed on the third insulating layer 30 and may be spaced apart from each other when viewed in a plan view. The input electrode IE and the output electrode OE may penetrate the second and third insulating layers 20 and 30 so as to be connected to one side portion and another side portion of the semiconductor pattern AL, respectively.

The display unit 210 according to an embodiment of the inventive concepts may further include an upper electrode UE. In the present embodiment, the third insulating layer 30 may include a lower layer 31 and an upper layer 32. However, embodiments of the inventive concepts are not limited thereto. In another embodiment, the third insulating layer 30 may have a single-layer structure.

The upper electrode UE may be disposed between the lower layer 31 and the upper layer 32. The upper electrode UE may overlap with the control electrode CE when viewed in a plan view. In the present embodiment, the upper electrode UE may receive the same electrical signal as the control electrode CE. Alternatively, the upper electrode UE may receive a different electrical signal from that of the control electrode CE and may function as an electrode of the capacitor CP. However, embodiments of the inventive concepts are not limited thereto. In another embodiment, the upper electrode UE may be omitted in the electronic panel 200.

The fourth insulating layer 40 may be disposed on the third insulating layer 30 to cover the input electrode IE and the output electrode OE. In another embodiment, the semiconductor pattern AL may be disposed on the control electrode CE in the thin film transistor TR. In still another embodiment, the semiconductor pattern AL may be disposed on the input electrode IE and the output electrode OE. In yet another embodiment, the input electrode IE and the output electrode OE may be disposed on the same layer as the semiconductor pattern AL and may be connected directly to the semiconductor pattern AL. The thin film transistor TR according to embodiments of the inventive concepts may have any one of various structures and is not limited to a specific embodiment.

The light emitting element EE may be disposed on the fourth insulating layer 40. The light emitting element EE may include a first electrode E1, an organic layer EL, and a second electrode E2.

The first electrode E1 may penetrate the fourth insulating layer 40 so as to be connected to the thin film transistor TR. Although not shown in the drawings, the electronic panel 200 may further include a connection electrode disposed between the first electrode E1 and the thin film transistor TR. In this case, the first electrode E1 may be electrically connected to the thin film transistor TR through the connection electrode.

The fifth insulating layer 50 may be disposed on the fourth insulating layer 40. The fifth insulating layer 50 may include an organic material and/or an inorganic material and may have a single-layered or multi-layered structure. An opening may be defined in the fifth insulating layer 50. The opening may expose at least a portion of the first electrode E1. The fifth insulating layer 50 may be a pixel defining layer.

The organic layer EL may be disposed between the first electrode E1 and the second electrode E2. The organic layer EL may include at least one emission layer. For example, the organic layer EL may include at least one of material for emitting a red light, a green light, and a blue light. In an embodiment, the organic layer EL may include a fluorescent material or a phosphorescent material. The organic layer EL may include an organic light emitting material or an inorganic light emitting material. The organic layer EL may emit light in response to a potential difference between the first electrode E1 and the second electrode E2.

In the present embodiment, the organic layer EL has a single unitary body shape overlapping with a plurality of the openings. However, embodiments of the inventive concepts are not limited thereto. The organic layer EL may be provided as a plurality of patterns corresponding to the openings, respectively.

Meanwhile, the organic layer EL may further include a charge control layer in addition to the emission layer. The charge control layer may control movement of charges to improve the luminous efficiency and the life span of the light emitting element EE. In this case, the organic layer EL may include at least one of a hole transfer material, a hole injection material, an electron transfer material, or an electron injection material.

The second electrode E2 may be disposed on the organic layer EL. The second electrode E2 may be opposite to the first electrode E1. The second electrode E2 may have a single unitary body shape extending from the active area AA into the peripheral area NAA. The second electrode E2 may be provided in common in a plurality of the pixels PX. The light emitting element EE of each of the pixels PX may receive a common power source signal (i.e., the second power source signal) through the second electrode E2.

The second electrode E2 may include a transparent conductive material or a semi-transparent conductive material. Thus, light generated from the organic layer EL may easily exit in the third direction DR3 through the second electrode E2. However, embodiments of the inventive concepts are not limited thereto. In another embodiment, the first electrode E1 may include a transparent or semi-transparent conductive material, and the light emitting element EE may be driven as a rear surface light emitting type. In still another embodiment, the light emitting element EE may be driven as a dual surface light emitting type in which light exits through a front surface and a rear surface.

The encapsulation layer 60 may be disposed on the light emitting element EE to encapsulate the light emitting element EE. In some embodiments, a capping layer covering the second electrode E2 may be disposed between the second electrode E2 and the encapsulation layer 60.

The encapsulation layer 60 may include a first inorganic layer 61, an organic layer 62, and a second inorganic layer 63, which are stacked (e.g., sequentially stacked) in the third direction DR3. However, embodiments of the inventive concepts are not limited thereto. In another embodiment, the encapsulation layer 60 may further include a plurality of inorganic layers and/or organic layers.

The first inorganic layer 61 may cover the second electrode E2. The first inorganic layer 61 may prevent external moisture and/or oxygen from permeating into the light emitting element EE. For example, the first inorganic layer 61 may include silicon nitride, silicon oxide, silicon oxynitride, or a combination thereof. The first inorganic layer 61 may be formed by a chemical vapor deposition process.

The organic layer 62 may be disposed on the first inorganic layer 61 and may be in contact with the first inorganic layer 61. The organic layer 62 may provide a flat surface on the first inorganic layer 61. The organic layer 62 may cover a bent portion of a top surface of the first inorganic layer 61 and/or a particle existing on the first inorganic layer 61, and thus it is possible to block the influence of the state of the top surface of the first inorganic layer 61 on components formed on the organic layer 62. In addition, the organic layer 62 may relax or release stress between layers being in contact with the organic layer 62. The organic layer 62 may include an organic material and may be formed by a solution process such as a spin coating process, a slit coating process, and/or an inkjet process.

The second inorganic layer 63 may be disposed on the organic layer 62 to cover the organic layer 62. The second inorganic layer 63 may be stably formed on the top surface of the organic layer 62, which is relatively flat as compared with the top surface of the first inorganic layer 61. The second inorganic layer 63 may encapsulate moisture outputted from the organic layer 62 to prevent the moisture from being provided to the outside. For example, the second inorganic layer 63 may include silicon nitride, silicon oxide, silicon oxynitride, or a combination thereof. The second inorganic layer 63 may be formed by a chemical vapor deposition process.

In the present embodiment, the hole area HA may include the hole MH and a line area LA. The line area LA may be provided between the hole MH and the active area AA. The line area LA may surround the hole MH when viewed in a plan view (e.g., in a direction normal to the front surface FS). The light emitting element EE and/or the thin film transistor TR disposed in the active area AA may be omitted in the line area LA. Thus, the line area LA may have a transmittance higher than that of the active area AA.

Recess portions GV1, GV2 and GV3, a dam portion DMP and signal lines SL1 and SL2 of the display unit 210 may be disposed in the line area LA.

The recess portions GV1, GV2 and GV3 may be spaced apart from each other. For example, the recess portions GV1, GV2 and GV3 may include first to third recess portions GV1, GV2 and GV3 which are formed (e.g., sequentially formed) along a direction from the active area AA toward the hole MH. Each of the first to third recess portions GV1, GV2 and GV3 may have a closed loop shape surrounding the hole MH in a plan view (e.g., in a direction normal to the front surface FS) or may have an intermittent line shape surrounding at least a portion of the edge of the hole MH in a plan view (e.g., in a direction normal to the front surface FS).

Each of the recess portions GV1, GV2 and GV3 may be recessed from the top surface of the base substrate BS. Each of the recess portions GV1, GV2 and GV3 may be formed by removing a portion of the base substrate BS. A deposition pattern ELP may be disposed in each of the recess portions GV1, GV2 and GV3 and may be covered by at least one of the first inorganic layer 61 or the second inorganic layer 63.

Because the electronic panel 200 further includes the recess portions GV1, GV2 and GV3, continuity between the deposition pattern ELP and the light emitting element EE may be blocked. As a result, a permeating path of external moisture and/or oxygen may be substantially blocked, and thus damage to the components in the active area AA may be reduced or prevented.

In addition, the deposition patterns ELP in the recess portions GV1, GV2 and GV3 may be covered by the first inorganic layer 61 and/or the second inorganic layer 63, and thus it is possible to prevent the deposition pattern ELP from moving to and affecting other component(s) in a process of manufacturing the electronic panel 200. As a result, process reliability of the electronic panel 200 may be improved. However, embodiments of the inventive concepts are not limited thereto. In other embodiments, only one of the recess portions GV1, GV2 and GV3 may be provided, or the recess portions GV1, GV2 and GV3 may be omitted.

The dam portion DMP may be disposed in the line area LA to partition a formation area of the organic layer 62 and to reduce or prevent additional expansion of the organic layer 62. The dam portion DMP may be provided in plurality, and the plurality of dam portions DMP may be disposed between the recess portions GV1, GV2 and GV3. The dam portion DMP may have a stack structure including first to third layers P11, P12 and P13. However, embodiments of the inventive concepts are not limited thereto. In another embodiment, the dam portion DMP may have a single-layer structure.

In an embodiment, the electronic panel 200 may further include a planarization layer OC. The planarization layer OC may include an organic material. The planarization layer OC may be disposed in the hole area HA. The planarization layer OC may cover a non-flat surface defined in the hole area HA by the dam portion DMP and/or the recess portions GV1, GV2 and GV3 and may provide a flat top surface. Thus, the flat surface may be provided (e.g., stably provided) in an area of the hole area HA, in which the organic layer 62 is not disposed.

The sensing unit 220 may include a plurality of conductive patterns and a plurality of sensing insulating layers 71, 72 and 73. For example, the sensing insulating layers 71, 72 and 73 may include first to third sensing insulating layers 71, 72 and 73 stacked (e.g., sequentially stacked) in the third direction DR3.

The first sensing insulating layer 71 may cover the planarization layer OC. In the present embodiment, the first sensing insulating layer 71 may cover the top surface of the planarization layer OC in the hole area HA and may cover a top surface of the second inorganic layer 63 in the active area AA. The conductive patterns HCP, HCL (e.g., the crack detecting line HCL of FIG. 3C), BRH, BP and SP may be disposed on the first sensing insulating layer 71.

Each of the second and third sensing insulating layers 72 and 73 may have a single unitary body shape overlapping with the hole area HA and the active area AA. The conductive patterns HCP, HCL, BRH, BP and SP may be covered by the third sensing insulating layer 73.

Each of the first to third sensing insulating layers 71, 72 and 73 may include an inorganic layer and/or an organic layer. Each of the first to third sensing insulating layers 71, 72 and 73 is a single layer in the present embodiment. Alternatively, each of the first to third sensing insulating layers 71, 72 and 73 may have a stack structure including a plurality of layers being in contact with each other.

The conductive patterns HCP, HCL, BRH, BP and SP may include the crack detecting pattern HCP, the crack detecting line HCL, the connection line BRH, a connection pattern BP, and a sensing pattern SP. At least some of the conductive patterns HCP, HCL, BRH, BP and SP may constitute at least one of the sensing electrodes TE1 and TE2 (see FIG. 3C) and the crack detecting circuit HCC (see FIG. 3C).

The sensing pattern SP may be disposed in the active area AA. In the present embodiment, the sensing pattern SP may form one of the first main pattern SP1 (see FIG. 3C), the first adjacent pattern SP1H (see FIG. 3C), the second main pattern SP2 (see FIG. 3C), or the second adjacent pattern SP2H (see FIG. 3C).

The connection pattern BP may be disposed in the active area AA. The connection pattern BP may be disposed between the first sensing insulating layer 71 and the second sensing insulating layer 72. The connection pattern BP may be disposed on a different layer from a layer at which the sensing pattern SP is disposed.

In the present embodiment, the connection pattern BP may be one of the first connection pattern BP1 (see FIG. 3C) and the second connection pattern BP2 (see FIG. 3C). The sensing pattern SP may be connected to the connection pattern BP and may be electrically connected to another sensing pattern adjacent thereto.

In the present embodiment, most of the first and second sensing electrodes TE1 and TE2 (see FIG. 3C) may be disposed between the second sensing insulating layer 72 and the third sensing insulating layer 73, and one of the first connection pattern BP1 and the second connection pattern BP2 may be disposed at a different layer to connect the sensing patterns adjacent to each other. However, embodiments of the inventive concepts are not limited thereto. In another embodiment, the first sensing electrode TE1 and the second sensing electrode TE2 may be disposed at different layers.

The crack detecting pattern HCP may be disposed in the hole area HA. The crack detecting pattern HCP may be spaced apart from the sensing pattern SP. Thus, the crack detecting pattern HCP and the sensing pattern SP may receive independent electrical signals of each other. Therefore, the crack detecting pattern HCP may be operated independently of the sensing pattern SP. In the present embodiment, the crack detecting pattern HCP may be disposed on the planarization layer OC. The crack detecting pattern HCP may be disposed at the same layer as the sensing pattern SP. The crack detecting pattern HCP may be disposed between the second sensing insulating layer 72 and the third sensing insulating layer 73.

The crack detecting pattern HCP and the sensing pattern SP may be formed using one mask at the same time, and thus processes may be simplified and process costs may be reduced. However, embodiments of the inventive concepts are not limited thereto. In another embodiment, the crack detecting pattern HCP may be disposed at a different layer from a layer at which the sensing pattern SP is disposed.

The connection line BRH may be disposed on a different layer from the layer on which the crack detecting pattern HCP is disposed. The connection line BRH may be disposed between the first sensing insulating layer 71 and the second sensing insulating layer 72. The crack detecting pattern HCP may penetrate the second sensing insulating layer 72 so as to be connected to the connection line BRH. The connection line BRH may extend into the peripheral area NAA (see FIG. 3C) and may connect the crack detecting line HCL (see FIG. 3C) and the crack detecting pattern HCP.

According to the embodiments of the inventive concepts, the crack detecting pattern HCP may be disposed in the hole area HA to check whether a crack occurs in the hole area HA or not. In addition, because the connection line BRH is disposed at a different layer from the layer at which the sensing pattern SP is disposed, it is possible to prevent electrical connection between the connection line BRH and the sensing pattern SP which overlap with each other in a plan view (e.g., in a direction normal to the front surface FS). Thus, the crack detecting pattern HCP may be stably connected to the crack detecting line HCL without deformation of the shape of the sensing pattern SP.

Figure 5A:
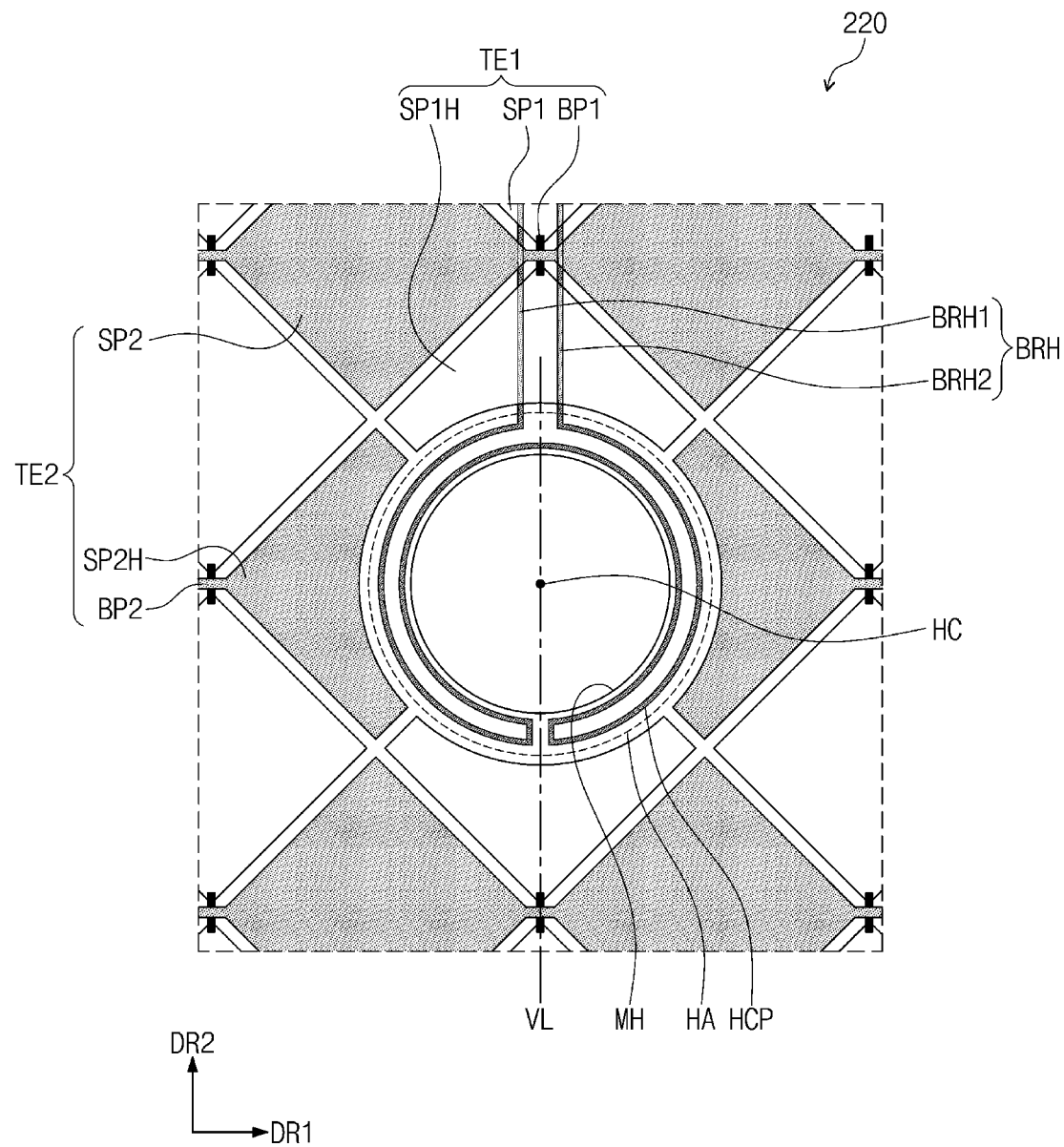
FIG. 5A is a plan view illustrating a portion of an electronic panel according to an embodiment of the inventive concepts.
Figure 5B:
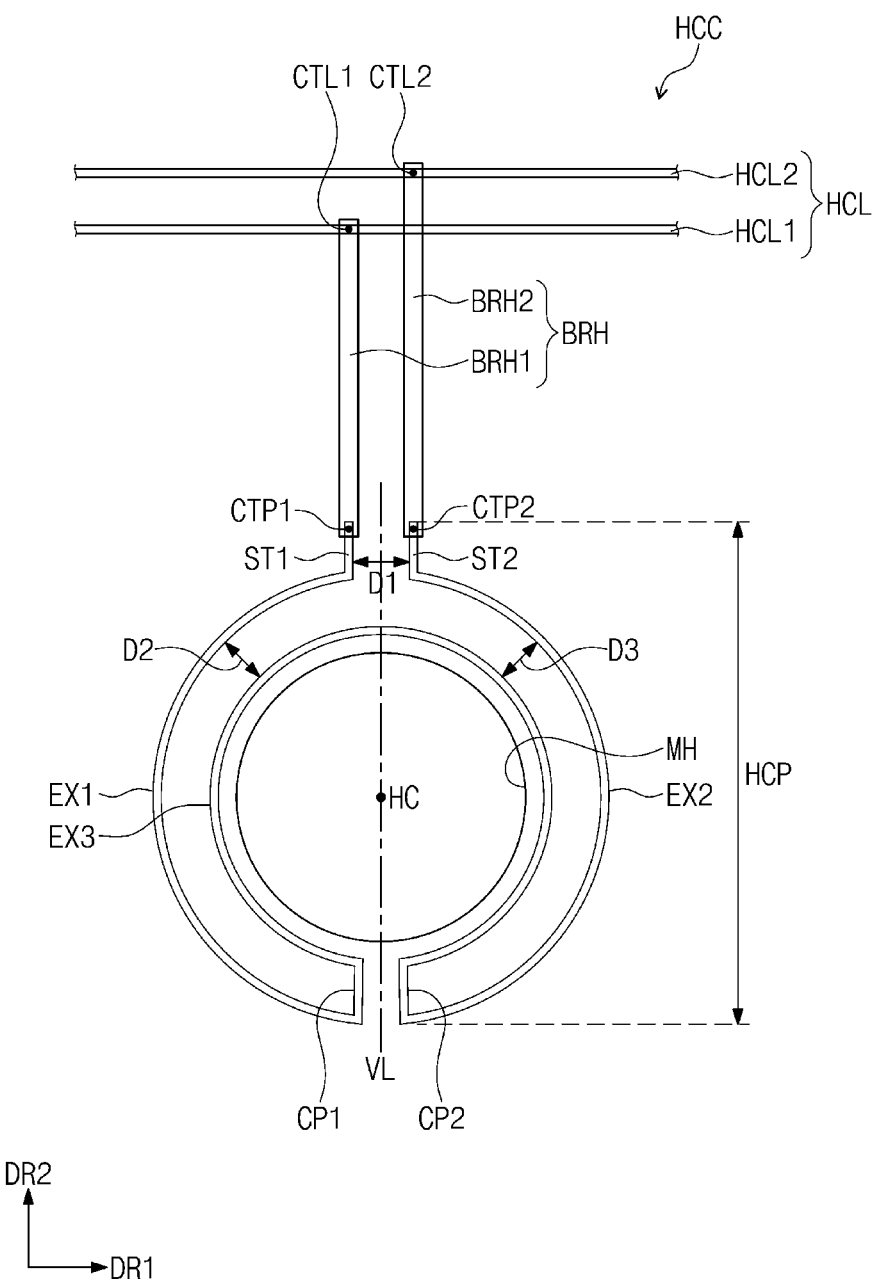
FIG. 5B is a plan view schematically illustrating a crack detecting circuit.

FIG. 5A is a plan view illustrating a portion of an electronic panel according to an embodiment of the inventive concepts. FIG. 5B is a plan view schematically illustrating a crack detecting circuit. Hereinafter, an embodiment of the inventive concepts will be described with reference to FIGS. 5A and 5B. Meanwhile, the same components as described with reference to FIGS. 1A-4 will be indicated by the same reference numerals or designators, and the descriptions thereto may be omitted for the purpose of ease and convenience of description.

FIG. 5A illustrates a portion of the sensing unit 220, which includes the hole area HA. FIG. 5A may correspond to the area XX' of FIG. 1B. As illustrated in FIG. 5A, the first adjacent patterns SP1H and the second adjacent patterns SP2H may be disposed along the edge of the hole area HA.

The first adjacent patterns SP1H which are spaced apart from each other in the second direction DR2 with the hole area HA interposed therebetween may be connected to each other through a connection pattern passing through the hole area HA. The connection pattern passing through the hole area HA is extended along a portion of the hole MH like the signal lines SL1 and SL2 (e.g., the signal lines SL1 and SL2 of FIG. 3b) and may connect the first adjacent patterns SP1H. Each of the first adjacent patterns SP1H may be connected to the first main pattern SP1 through the first connection pattern BP1.

The second adjacent patterns SP2H, which are spaced apart from each other in the first direction DR1 with the hole area HA interposed therebetween, may be connected to each other through another connection pattern passing through the hole area HA. The connection pattern passing through the hole area HA is extended along a portion of the hole MH in a similar manner as the signal lines SL1 and SL2 and may connect the second adjacent patterns SP2H. Each of the second adjacent patterns SP2H may be connected to the second main pattern SP2 through the second connection pattern BP2.

The connection lines BRH1 and BRH2 may be electrically insulated from each other. In the present embodiment, the first adjacent pattern SP1H, the second adjacent pattern SP2H, the first main pattern SP1, the second main pattern SP2 and the second connection pattern BP2 may be disposed at the same layer, and the first connection pattern BP1 may be disposed at a different layer from the layer at which the patterns SP1H, SP2H, SP1, SP2 and BP2 are disposed.

The crack detecting pattern HCP of the crack detecting circuit HCC (e.g., the crack detecting circuit HCC of FIG. 5B) may be disposed in the hole area HA and may have a shape extending along the edge of the hole area HA. The crack detecting pattern HCP may have a single unitary body shape. The crack detecting pattern HCP may have a shape extending along the edge of the hole MH when viewed in a plan view. The crack detecting pattern HCP may have an open curve shape including both ends separated from each other.

Meanwhile, a shape of the crack detecting pattern HCP according to the present embodiment may be line-symmetrical with respect to a symmetry axis VL. The symmetry axis VL may be an imaginary line passing through a center HC of the hole area HA. The crack detecting pattern HCP may have a bilaterally symmetrical shape with respect to the symmetry axis VL. Thus, the symmetry axis VL may be a symmetry axis of the crack detecting pattern HCP.

Referring to FIG. 5B, the crack detecting pattern HCP may include a first extension portion EX1, a second extension portion EX2, a third extension portion EX3, a first connecting portion CP1, a second connecting portion CP2, a first protrusion ST1, and a second protrusion ST2. The first extension portion EX1, the second extension portion EX2, the third extension portion EX3, the first connecting portion CP1, the second connecting portion CP2, the first protrusion ST1 and the second protrusion ST2 may be connected to each other to constitute a single unitary body shape.

The first extension portion EX1 and the second extension portion EX2 may face each other (e.g., may be opposite each other) with respect to the symmetry axis VL. Each of the first and second extension portions EX1 and EX2 may be disposed in the hole area HA and may extend along the edge of the hole area HA. The first extension portion EX1 and the second extension portion EX2 may be disposed in the line area LA (e.g., the line area LA of FIG. 4).

The first extension portion EX1 may be disposed at a left side of the symmetry axis VL, and the second extension portion EX2 may be disposed at a right side of the symmetry axis VL. The first extension portion EX1 may have a semicircular shape convex to the left, and the second extension portion EX2 may have a semicircular shape convex to the right. The first extension portion EX1 and the second extension portion EX2 may be line-symmetrical with respect to the symmetry axis VL.

The third extension portion EX3 may be spaced apart from the first extension portion EX1 and the second extension portion EX2. The third extension portion EX3 may be closer to the center HC of the hole area HA than the first extension portion EX1 and the second extension portion EX2.

The third extension portion EX3 may be disposed in the hole area HA and may extend along the edge of the hole area HA. The third extension portion EX3 may overlap with the symmetry axis VL when viewed in a plan view (e.g., in a direction normal to the front surface FS). The third extension portion EX3 may intersect the symmetry axis VL.

The first connecting portion CP1 may connect a first end of the first extension portion EX1 and a first end of the third extension portion EX3. The second connecting portion CP2 may be spaced apart from the first connecting portion CP1 and may connect a first end of the second extension portion EX2 and a second end of the third extension portion EX3.

The first connecting portion CP1 and the second connecting portion CP2 may face each other with the symmetry axis VL interposed therebetween. The first connecting portion CP1 and the second connecting portion CP2 may extend in parallel to an extending direction of the symmetry axis VL. In other words, the first connecting portion CP1 and the second connecting portion CP2 may be parallel to the symmetry axis VL in the present embodiment. The first connecting portion CP1 and the second connecting portion CP2 may be line-symmetrical with respect to the symmetry axis VL.

The first protrusion ST1 may be connected to a second end of the first extension portion EX1, and the second protrusion ST2 may be connected to a second end of the second extension portion EX2. The first protrusion ST1 and the second protrusion ST2 may be line-symmetrical with respect to the symmetry axis VL.

The connection line BRH may connect the crack detecting pattern HCP and the crack detecting line HCL. The connection line BRH may include a first connection line BRH1 and a second connection line BRH2. The first connection line BRH1 and the second connection line BRH2 may be connected to different crack detecting lines from each other.

For example, the first connection line BRH1 may connect the first protrusion ST1 of the crack detecting pattern HCP and a first crack detecting line HCL1. The second connection line BRH2 may connect the second protrusion ST2 of the crack detecting pattern HCP and a second crack detecting line HCL2.

However, embodiments of the inventive concepts are not limited thereto. In another embodiment, at least one of the protrusions ST1 and ST2 may be omitted in the crack detecting circuit HCC. In this case, the first connection line BRH1 or the second connection line BRH2 may be connected directly to the first extension portion EX1 or the second extension portion EX2.

In the present embodiment, the first and second connection lines BRH1 and BRH2 may be disposed on a different layer from a layer on which the crack detecting pattern HCP and the crack detecting line HCL are disposed. Thus, contact portions CTP1, CTL1, CTP2 and CTL2 may be formed between the first connection line BRH1 and the first protrusion ST1, between the first connection line BRH1 and the first crack detecting line HCL1, between the second connection line BRH2 and the second protrusion ST2, and between the second connection line BRH2 and the second crack detecting line HCL2.

An input signal received from a first end of the first crack detecting line HCL1 may be provided into the crack detecting pattern HCP through the first connection line BRH1 and the first protrusion ST1, may pass through the first extension portion EX1, the first connecting portion CP1, the third extension portion EX3, the second connecting portion CP2, and the second extension portion EX2, may be outputted from the crack detecting pattern HCP through the second protrusion ST2, and then, may be outputted to a first end of the second crack detecting line HCL2 via the second connection line BRH2.

An input signal received from a second end of the second crack detecting line HCL2 may be provided into the crack detecting pattern HCP through the second connection line BRH2 and the second protrusion ST2, may pass through the second extension portion EX2, the second connecting portion CP2, the third extension portion EX3, the first connecting portion CP1, and the first extension portion EX1, may be outputted from the crack detecting pattern HCP through the first protrusion ST1, and then, may be outputted to a second end of the first crack detecting line HCL1 via the first connection line BRH1.

Damage of the crack detecting pattern HCP and/or the crack detecting line HCL may be checked or determined using a signal outputted through the first end of the second crack detecting line HCL2 and a signal outputted through the other end of the first crack detecting line HCL1. Thus, it is possible to easily sense an occurrence or nonoccurrence of a crack in the hole area HA and/or an occurrence or nonoccurrence of a crack in the peripheral area NAA. As a result, the reliability of the electronic panel 200 may be improved.

While a crack detecting signal is provided to the crack detecting pattern HCP, currents in opposite directions may flow through the first and third extension portions EX1 and EX3 adjacent to each other, through the second and third extension portions EX2 and EX3 adjacent to each other, and through the first and second connecting portions CP1 and CP2 adjacent to each other. For example, when the input signal is provided through the first crack detecting line HCL1, a direction of the current passing through the first and second extension portions EX1 and EX2 may be a counterclockwise direction with respect to the center HC of the hole area HA, and a direction of the current passing through the third extension portion EX3 may be a clockwise direction with respect to the center HC of the hole area HA. In addition, a direction of the current passing through the first connecting portion CP1 may be the second direction DR2, and a direction of the current passing through the second connecting portion CP2 may be an opposite direction to the second direction DR2.

Thus, a parasitic capacitance may increase as a distance D1 between the first and second protrusions ST1 and ST2 adjacent to each other decreases, a parasitic capacitance may increase as a distance D2 between the first and third extension portions EX1 and EX3 adjacent to each other decreases, and a parasitic capacitance may increase as a distance D3 between the second and third extension portions EX2 and EX3 adjacent to each other decreases. Electrical interference between the input and output signals may decrease as the distance D1 between the first and second protrusions ST1 and ST2 increases, and thus electrical reliability may be improved.

In addition, the distance D2 between the first and third extension portions EX1 and EX3 may be designed to be substantially equal to the distance D3 between the second and third extension portions EX2 and EX3, and thus the parasitic capacitance occurring at a left side of the symmetry axis VL may be substantially equal to the parasitic capacitance occurring at a right side of the symmetry axis VL.

According to the embodiments of the inventive concepts, the crack detecting pattern HCP may have the line-symmetrical shape with respect to the symmetry axis VL. Thus, a resistance of the crack detecting pattern HCP at the left side of the symmetry axis VL may be substantially equal to a resistance of the crack detecting pattern HCP at the right side of the symmetry axis VL when the first protrusion ST1 is used as the input terminal or when the second protrusion ST2 is used as the input terminal. As a result, occurrence of static electricity in the crack detecting pattern HCP may be reduced and damage of the crack detecting pattern HCP caused by the static electricity may be inhibited or prevented. Accordingly, the reliability of the electronic panel 200 may be improved.

According to the embodiments of the inventive concepts, the electronic panel 200 may include the crack detecting pattern HCP having the line-symmetrical shape with respect to the symmetry axis VL. The symmetry axis VL may pass through the center HC of the hole area HA and may pass between the first and second protrusions ST1 and ST2 functioning as the input/output terminals of the crack detecting pattern HCP.

Thus, an occurrence or nonoccurrence of a crack in the electronic panel 200 may be easily inspected or checked without an additional apparatus. In addition, the occurrence of the static electricity in the crack detecting pattern HCP may be reduced, and thus the electrical reliability may be improved.

Figure 6A:
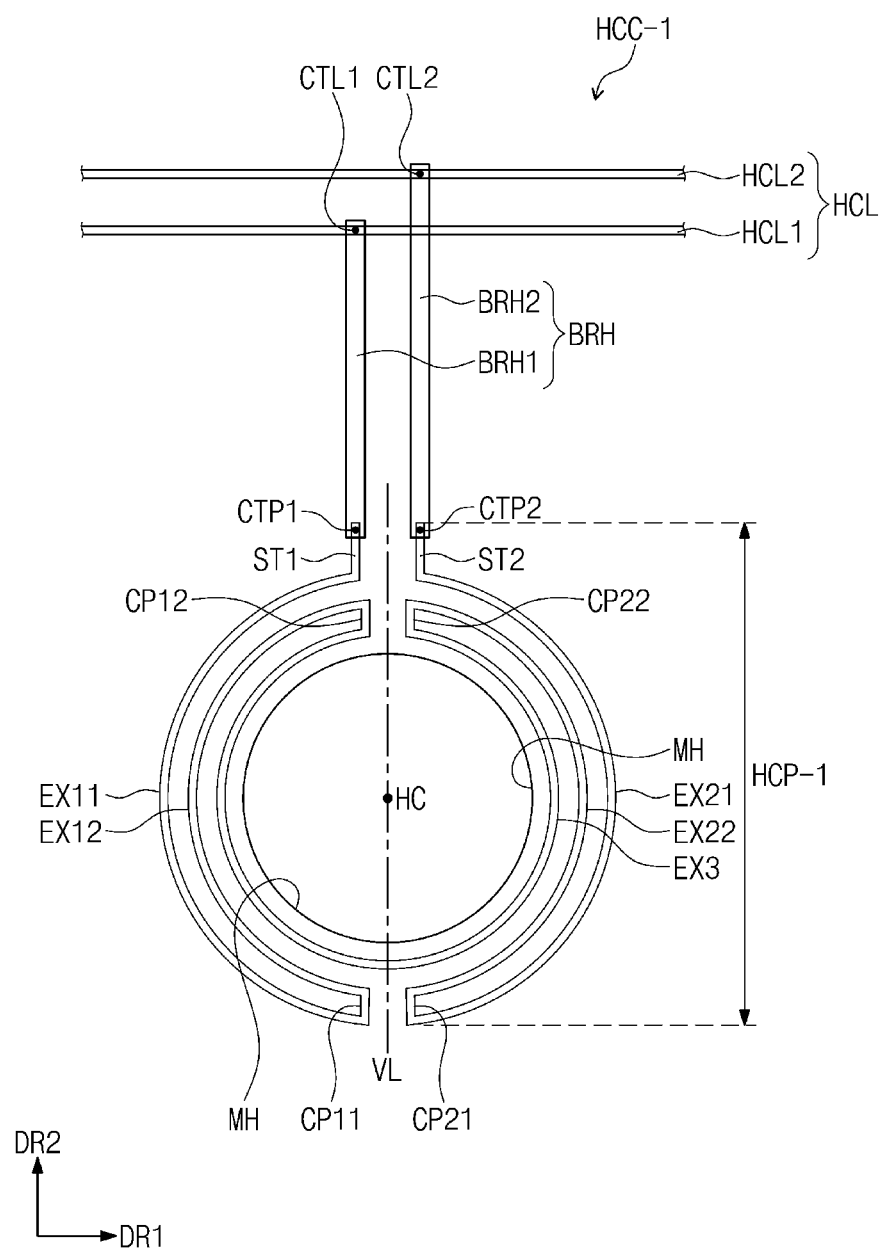
FIGS. 6A to 6C are plan views illustrating crack detecting patterns according to some embodiments of the inventive concepts.
Figure 6B:
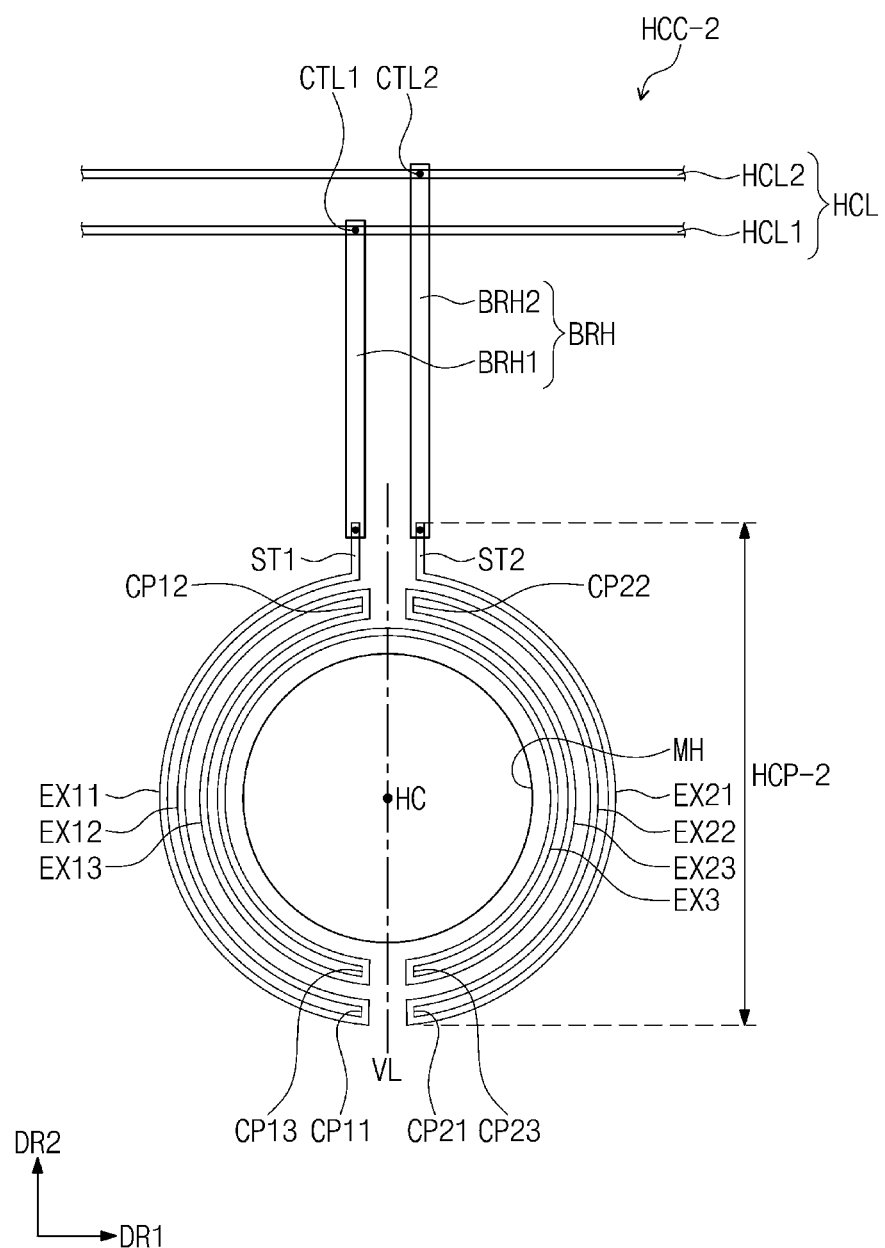
Figure 6C:
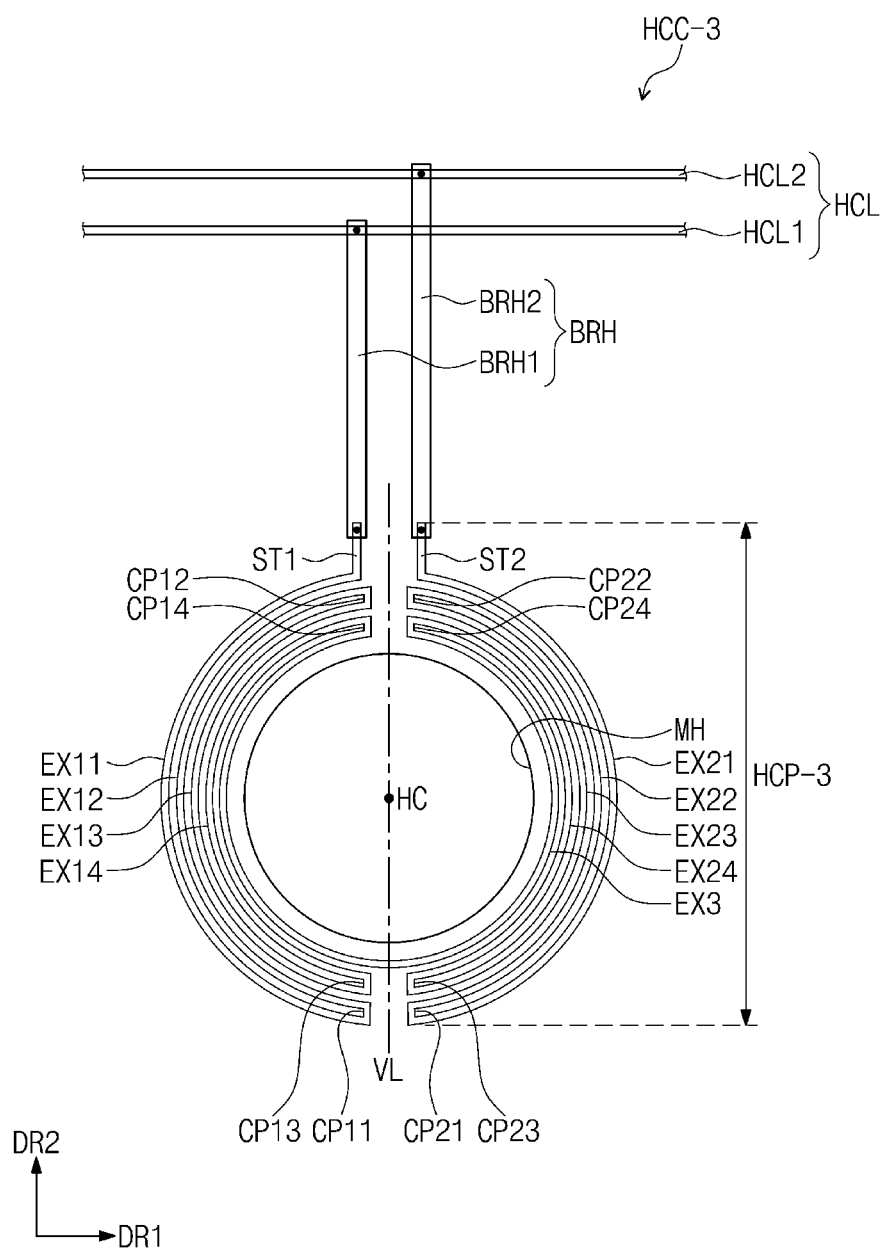

FIGS. 6A-6C are plan views illustrating crack detecting patterns according to some embodiments of the inventive concepts. Hereinafter, embodiments of the inventive concepts will be described with reference to FIGS. 6A-6C. Meanwhile, the same components as described with reference to FIGS. 1A-5B will be indicated by the same reference numerals or designators, and the descriptions thereof may be omitted for the purpose of ease and convenience in description.

According to an embodiment of the inventive concepts, each of the first extension portion EX1, the second extension portion EX2, the first connecting portion CP1 and the second connecting portion CP2 of the crack detecting pattern HCP of FIG. 5B may be provided in plurality. Thus, a crack detecting pattern having a density higher than that of the crack detecting pattern HCP of FIG. 5B may be designed.

For example, as illustrated in FIG. 6A, a crack detecting pattern HCP-1 may include a plurality of first extension portions EX11 and EX12, a plurality of second extension portions EX21 and EX22, a plurality of first connecting portions CP11 and CP12, and a plurality of second connecting portions CP21 and CP22. One of the first connecting portions CP11 and CP12 (e.g., the first connecting portion CP11) may connect the first extension portions EX11 and EX12 (e.g., the first extension portion EX11), and the other thereof (e.g., the first connecting portion CP12) may connect one of the first extension portions EX11 and EX12 (e.g., the first extension portion EX12) to the third extension portion EX3. One of the second connecting portions CP21 and CP22 (e.g., the second connecting portion CP21) may connect the second extension portions EX21 and EX22, and the other thereof (e.g., the second connection portion CP22) may connect one of the second extension portions EX21 and EX22 (e.g., the second extension portion EX22) to the third extension portion EX3.

The first extension portions EX11 and EX12 may be spaced apart from each other at substantially the same distance, and the second extension portions EX21 and EX22 may be spaced apart from each other at substantially the same distance. The first extension portions EX11 and EX12 and the second extension portions EX21 and EX22 may be line-symmetrical with respect to the symmetry axis VL. The first connecting portions CP11 and CP12 and the second connecting portions CP21 and CP22 may be line-symmetrical with respect to the symmetry axis VL.

Referring to FIG. 6B, a crack detecting circuit HCC-2 may include a crack detecting pattern HCP-2 which has a greater area (or size) than the crack detecting pattern HCP-1 of the crack detecting circuit HCC-1 of FIG. 6A. The crack detecting pattern HCP-2 may include three first extension portions EX11, EX12 and EX13, three second extension portions EX21, EX22 and EX23, three first connecting portions CP11, CP12 and CP13, and three second connecting portions CP21, CP22 and CP23.

The first extension portion EX11 and the second extension portion EX21 of the first extension portions EX11, EX12 and EX13 and the second extension portions EX21, EX22 and EX23, which are disposed outermost from the center HC of the hole area HA, may be connected to the first protrusion ST1 and the second protrusion ST2, respectively. The first extension portion EX13 and the second extension portion EX23 of the first extension portions EX11, EX12 and EX13 and the second extension portions EX21, EX22 and EX23, which are closest to the center HC of the hole area HA, may be connected to the third extension portion EX3.

One of the first connecting portions CP11, CP12 and CP13 (e.g., the first connecting portion CP11) may connect one of the first extension portions EX11, EX12 and EX13 (e.g., the first extension portion EX11) to another of the first extension portions EX11, EX12 and EX13 (e.g., the first extension portion EX12). Another of the first connecting portions CP11, CP12 and CP13 (e.g., the first connecting portion CP12) may connect another of the first extension portions EX11, EX12 and EX13 (e.g., the first extension portion EX12) to the other of the first extension portions EX11, EX12 and EX13 (first extension portion EX13). The other of the first connecting portions CP11, CP12 and CP13 (e.g., the first connecting portion CP13) may connect the other of the first extension portions EX11, EX12 and EX13 (e.g., the first extension portion EX13) to the third extension portion EX3.

One of the second connecting portions CP21, CP22 and CP23 (e.g., the second connecting portion CP21) may connect one of the second extension portions EX21, EX22 and EX23 (e.g., the second extension portion EX21) to another of the second extension portions EX21, EX22 and EX23 (e.g., the second extension portions EX22). Another of the second connecting portions CP21, CP22 and CP23 (e.g., the second connecting portion CP22) may connect another of the second extension portions EX21, EX22 and EX23 (e.g., the second extension portion EX22) to the other of the second extension portions EX21, EX22 and EX23 (e.g., the second extension portion EX23). The other of the second connecting portions CP21, CP22 and CP23 (e.g., the second connecting portion CP23) may connect the other of the second extension portions EX21, EX22 and EX23 (e.g., the second extension portion EX23) to the third extension portion EX3.

The first extension portions EX11, EX12 and EX13 and the second extension portions EX21, EX22 and EX23 may be line-symmetrical with respect to the symmetry axis VL. In addition, the first connecting portions CP11, CP12 and CP13 and the second connecting portions CP21, CP22 and CP23 may be line-symmetrical with respect to the symmetry axis VL. Thus, the crack detecting pattern HCP-2 may have a line-symmetrical shape with respect to the symmetry axis VL.

Referring to FIG. 6C, a crack detecting circuit HCC-3 may include a crack detecting pattern HCP-3 having a greater area (or size) than the crack detecting pattern HCP-2 of the crack detecting circuit HCC-2 of FIG. 6B. The crack detecting pattern HCP-3 may include four first extension portions EX11, EX12, EX13 and EX14, four second extension portions EX21, EX22, EX23 and EX24, four first connecting portions CP11, CP12, CP13 and CP14, and four second connecting portions CP21, CP22, CP23 and CP24.

The first extension portion EX11 and the second extension portion EX21 of the first extension portions EX11 to EX14 and the second extension portions EX21 to EX24, which are disposed outermost from the center HC of the hole area HA, may be connected to the first protrusion ST1 and the second protrusion ST2, respectively. The first extension portion EX14 and the second extension portion EX24 of the first extension portions EX11 to EX14 and the second extension portions EX21 to EX24, which are closest to the center HC of the hole area HA, may be connected to the third extension portion EX3.

The first connecting portions CP11, CP12, CP13 and CP14 may be connected between the first extension portions EX11, EX12, EX13 and EX14 and the third extension portion EX3, respectively. The second connecting portions CP21, CP22, CP23 and CP24 may be connected between the second extension portions EX21, EX22, EX23 and EX24 and the third extension portion EX3, respectively.

The first extension portions EX11, EX12, EX13 and EX14 and the second extension portions EX21, EX22, EX23 and EX24 may be line-symmetrical with respect to the symmetry axis VL. In addition, the first connecting portions CP11, CP12, CP13 and CP14 and the second connecting portions CP21, CP22, CP23 and CP 24 may be line-symmetrical with respect to the symmetry axis VL. Thus, the crack detecting pattern HCP-3 may have a line-symmetrical shape with respect to the symmetry axis VL.

Figure 7A:
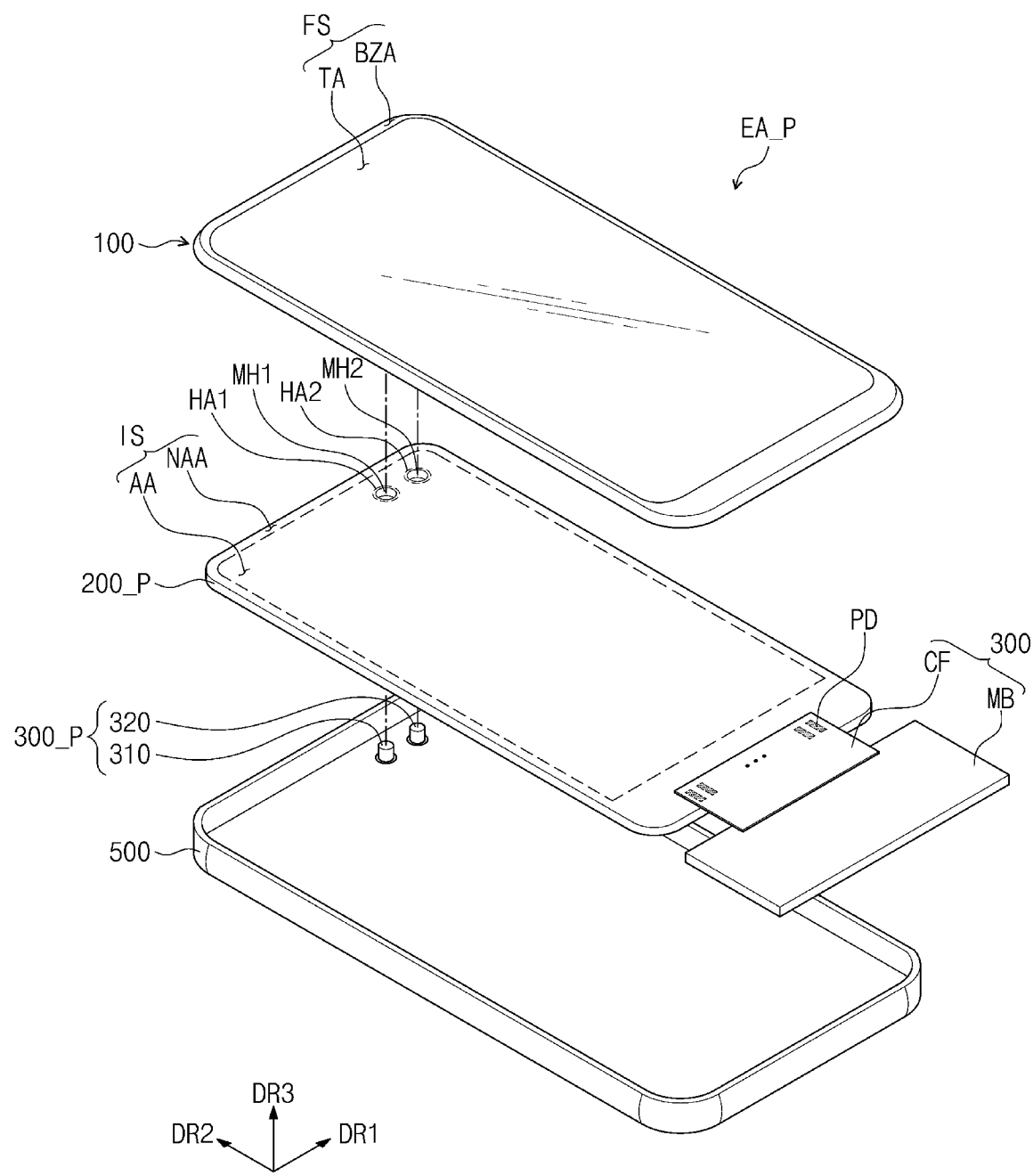
FIG. 7A is an exploded perspective view illustrating an electronic apparatus according to an embodiment of the inventive concepts.
Figure 7B:
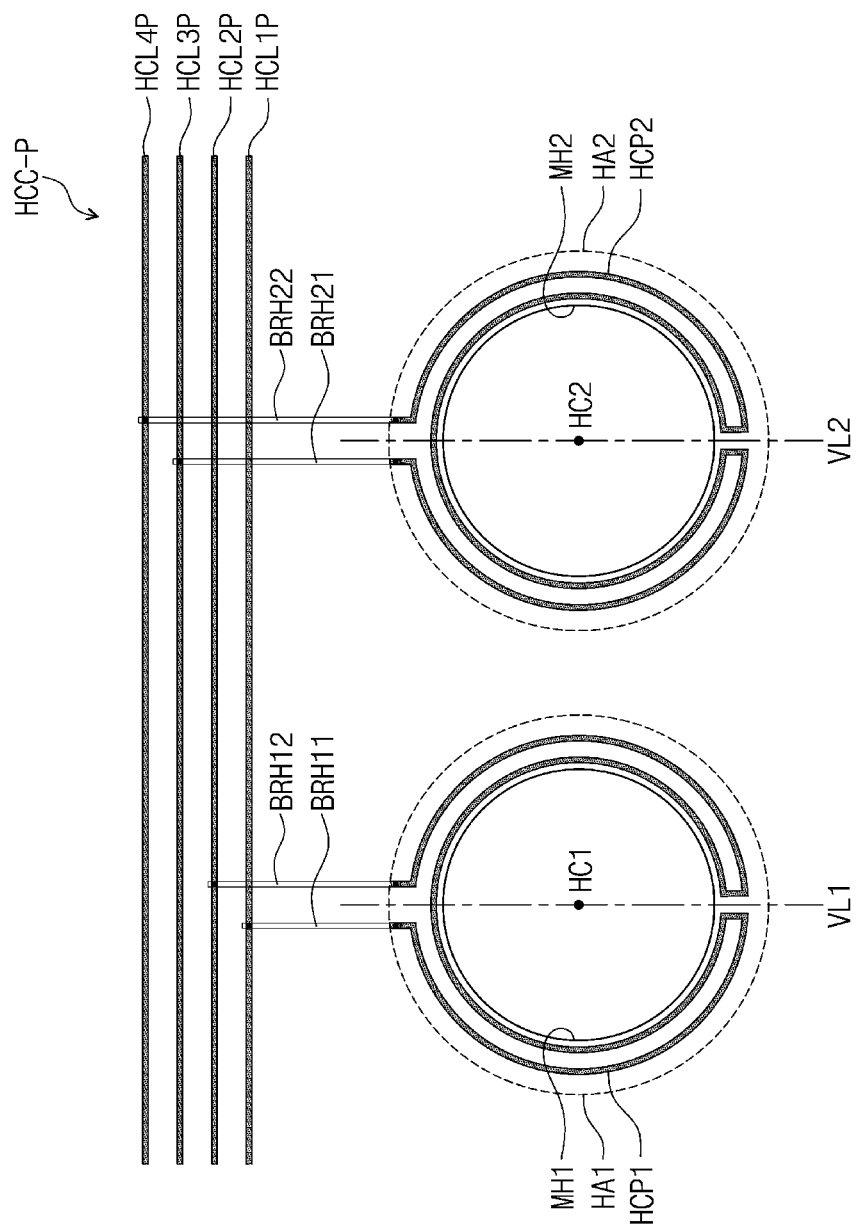
FIG. 7B is a plan view illustrating some components of FIG. 7A.

FIG. 7A is an exploded perspective view illustrating an electronic apparatus according to an embodiment of the inventive concepts. FIG. 7B is a plan view illustrating some components of FIG. 7A. FIG. 7B schematically illustrates a crack detecting circuit for the purpose of ease and convenience in description and illustration. Hereinafter, an embodiment of the inventive concepts will be described with reference to FIGS. 7A and 7B. Meanwhile, the same components as described with reference to FIGS. 1A to 6C will be indicated by the same reference numerals or designators, and the descriptions thereto may be omitted for the purpose of ease and convenience in description.

As illustrated in FIG. 7A, an electronic apparatus EA_P may include an electronic panel 200_P and a plurality of electronic modules 300_P. Except that the electronic panel 200_P includes a plurality of hole areas HA1 and HA2, the electronic apparatus EA_P may substantially correspond to the electronic apparatus EA illustrated in FIG. 1B. Hereinafter, duplicated descriptions may be omitted.

The plurality of hole areas HA1 and HA2 may include a first hole area HA1 and a second hole area HA2. The first hole area HA1 and the second hole area HA2 may be spaced apart from each other along the first direction DR1. A first hole MH1 and a second hole MH2 which penetrate the electronic panel 200_P may be defined in the first hole area HA1 and the second hole area HA2, respectively.

The electronic modules 300_P may include a first module 310 and a second module 320. Each of the first and second modules 310 and 320 may include at least one of the components of the electronic modules EM1 and EM2 described above.

Referring to FIG. 7B, the electronic panel 200_P may include a crack detecting circuit HCC-P for sensing or checking whether a crack occurs in the hole areas HA1 and HA2. The crack detecting circuit HCC-P may include a first crack detecting pattern HCP1 disposed in the first hole area HA1 and a second crack detecting pattern HCP2 disposed in the second hole area HA2. The first crack detecting pattern HCP1 may have a bilaterally symmetrical shape with respect to a first symmetry axis VL1 passing through a center HC1 of the first hole area HA1. The second crack detecting pattern HCP2 may have a bilaterally symmetrical shape with respect to a second symmetry axis VL2 passing through a center HC2 of the second hole area HA2.

A shape of each of the first and second crack detecting patterns HCP1 and HCP2 corresponds to the shape of the crack detecting pattern HCP of FIG. 5A in the present embodiment. However, embodiments of the inventive concepts are not limited thereto. In certain embodiments, the shapes of the first and second crack detecting patterns HCP1 and HCP2 may be variously designed or modified under the condition that the first and second crack detecting patterns HCP1 and HCP2 have line-symmetrical shapes with respect to the first and second symmetry axes VL1 and VL2, respectively. In addition, the first and second crack detecting patterns HCP1 and HCP2 may have the same shape in the present embodiment. Alternatively, the first and second crack detecting patterns HCP1 and HCP2 may have different shapes.

Crack detecting lines connected to the first crack detecting pattern HCP1 may be different from crack detecting lines connected to the second crack detecting pattern HCP2. The first crack detecting pattern HCP1 may be connected to a first crack detecting line HCL1P through a first connection line BRH11 and may be connected to a second crack detecting line HCL2P through a second connection line BRH12. The second crack detecting pattern HCP2 may be connected to a third crack detecting line HCL3P through a third connection line BRH21 and may be connected to a fourth crack detecting line HCL4P through a fourth connection line BRH22.

According to the embodiment of the inventive concepts, the electronic panel 200_P may include the first crack detecting pattern HCP1 and the second crack detecting pattern HCP2 separated from each other, and thus it is possible to check or determine whether a crack has occurred in each of the first and second hole areas HA1 and HA2 or not. In addition, according to the embodiment of the inventive concepts, the first and second crack detecting patterns HCP1 and HCP2 may be designed to have the line-symmetrical shapes with respect to the first and second symmetry axes VL1 and VL2, respectively, and thus it is possible to inhibit or prevent the first and second crack detecting patterns HCP1 and HCP2 from being damaged by an occurrence of a discharge of static electricity. As a result, reliability of the electronic apparatus EA_P may be improved.

Figure 8:
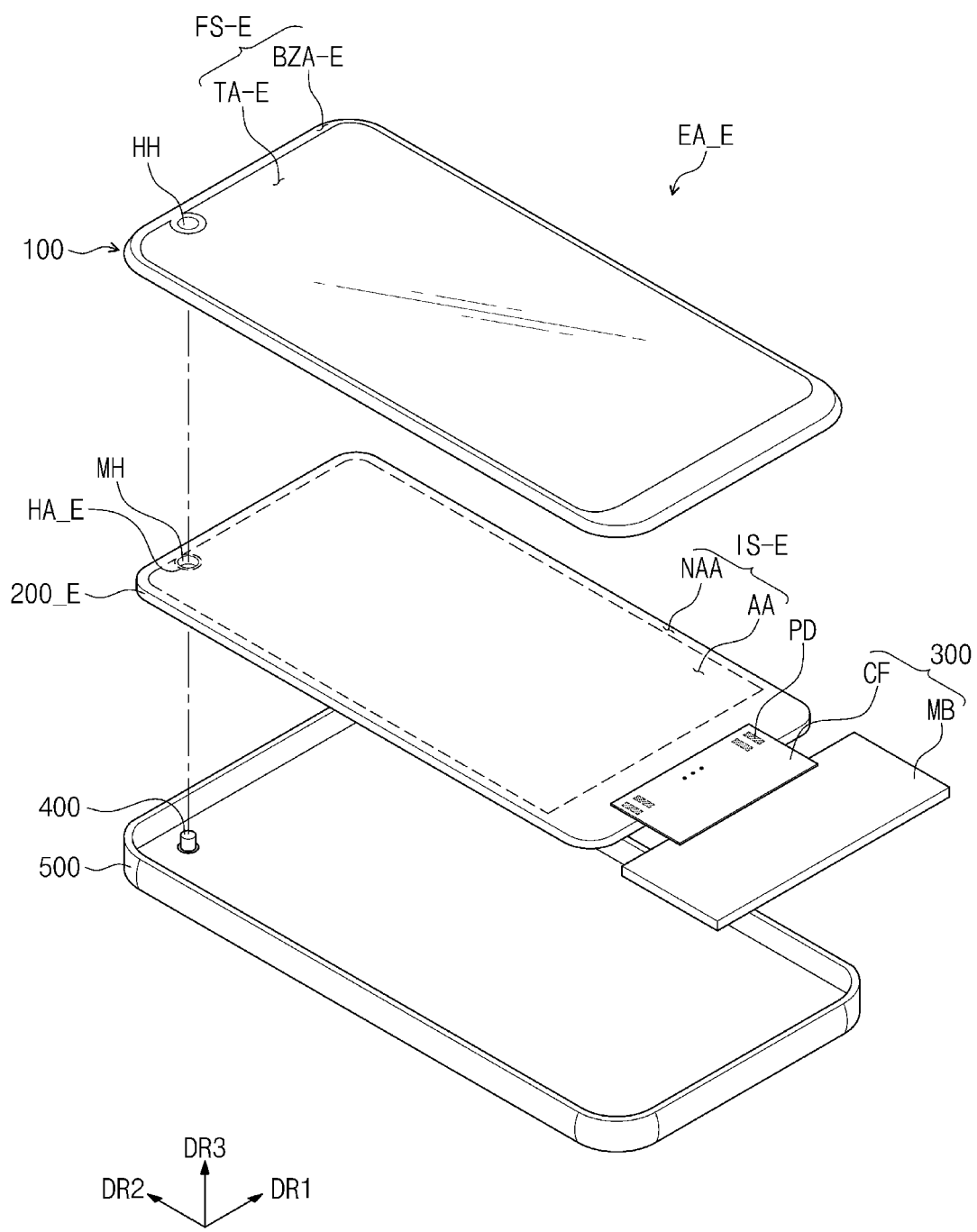
FIG. 8 is an exploded perspective view illustrating an electronic apparatus according to an embodiment of the inventive concepts.
Figure 9A:
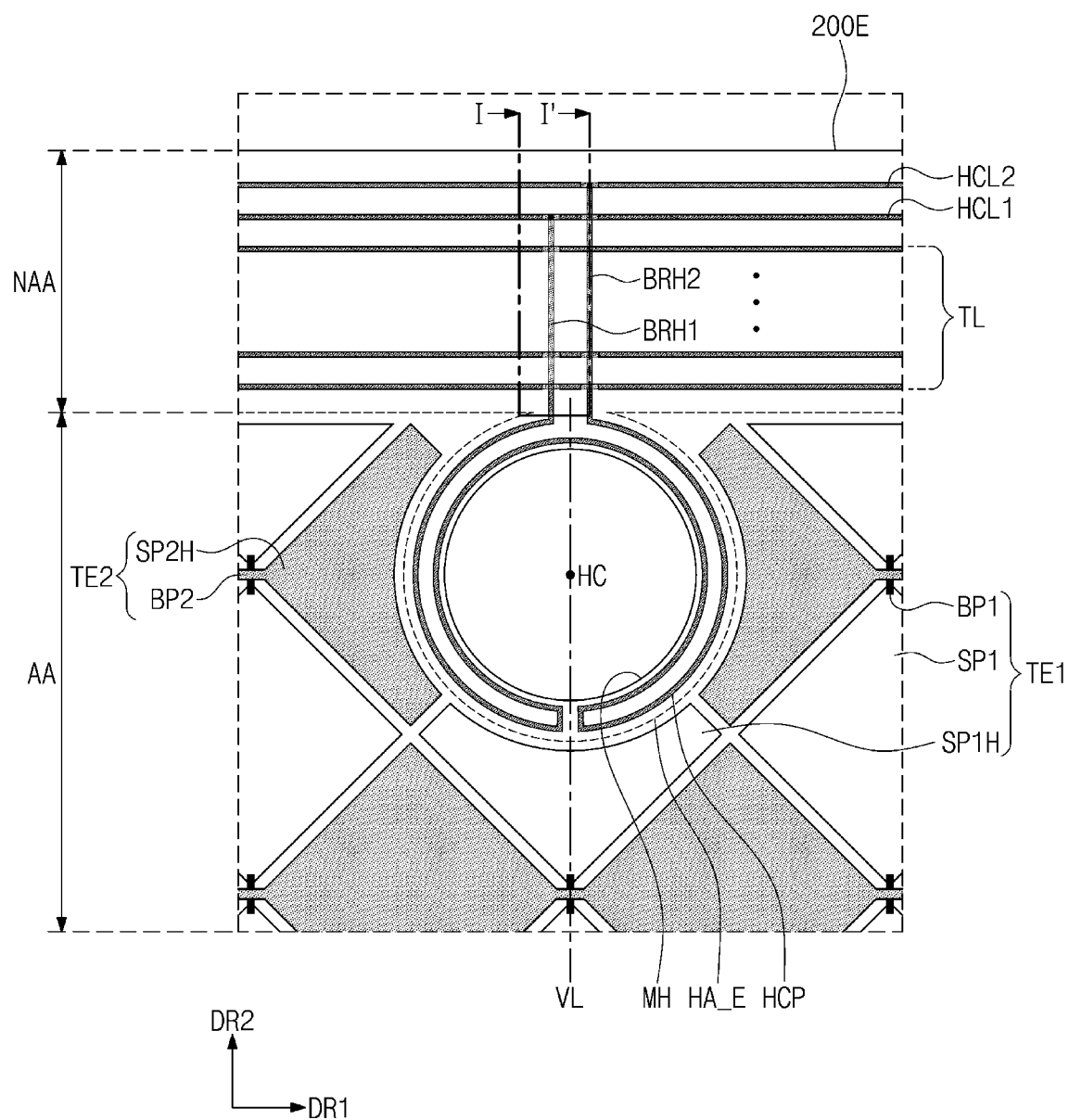
FIG. 9A is a plan view illustrating a portion of FIG. 8.
Figure 9B:
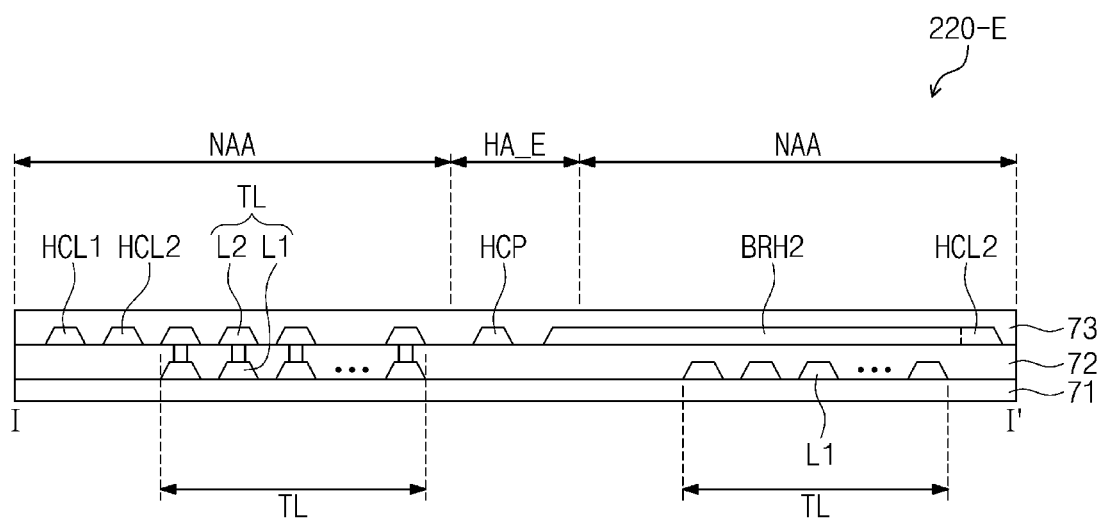
FIG. 9B is a cross-sectional view taken along the line I-I' of FIG. 9A.

FIG. 8 is an exploded perspective view illustrating an electronic apparatus according to an embodiment of the inventive concepts. FIG. 9A is a plan view illustrating a portion of FIG. 8. FIG. 9B is a cross-sectional view taken along the line I-I' of FIG. 9A. Hereinafter, an embodiment of the inventive concepts will be described with reference to FIGS. 8-9B. Meanwhile, the same components as described with reference to FIGS. 1A-7B will be indicated by the same reference numerals or designators, and the descriptions thereto may be omitted for the purpose of ease and convenience in description.

As illustrated in FIG. 8, a hole MH may be defined adjacent to the peripheral area NAA in an electronic apparatus EA_E. Thus, in a front surface IS-E of an electronic panel 200_E, a hole area HA_E may be defined at a position adjacent to both the peripheral area NAA and the active area AA.

Shapes of a transmission area TA-E and a bezel area BZA-E of a front surface FS-E of the window 100 may correspond to shapes of the active area AA and the peripheral area NAA. The transmission area TA-E may cover the active area AA, and the bezel area BZA-E may cover the peripheral area NAA and the hole active area HA_E. An open portion HH corresponding to the hole MH may be defined in the bezel area BZA-E.

Referring to FIG. 9A, the hole area HA_E may be disposed in the active area AA and may be surrounded by one first adjacent pattern SP1H, two second adjacent patterns SP2H, and the peripheral area NAA. The crack detecting pattern HCP may be disposed in the hole area HA_E and may extend along the edge of the hole MH. The crack detecting pattern HCP may have a line-symmetrical shape with respect to a symmetry axis VL passing through a center HC of the hole area HA_E.

The connection lines BRH1 and BRH2 may connect both ends of the crack detecting pattern HCP to the crack detecting lines HCL1 and HCL2, respectively. The crack detecting lines HCL1 and HCL2 may be disposed adjacent to a side surface of the electronic panel 200_E, and a plurality of sensing lines TL may be arranged in the second direction DR2 between the active area AA and the crack detecting lines HCL1 and HCL2. The sensing lines TL may be spaced apart from each other.

The connection lines BRH1 and BRH2 may cross over the sensing lines TL and may be connected to the corresponding crack detecting lines HCL1 and HCL2, respectively. In the present embodiment, the connection lines BRH1 and BRH2 and the crack detecting pattern HCP may be disposed at the same layer. The connection lines BRH1 and BRH2 and the crack detecting pattern HCP may be formed in a single unitary body or may be sequentially formed and be partially stacked.

The sensing lines TL and the first crack detecting line HCL1 may overlap with but be electrically insulated from at least one of the connection lines BRH1 and BRH2, which transmits a different signal from their signals. Referring to FIG. 9B, each of the sensing lines TL may have a double layer structure including a first line portion L1 and a second line portion L2. Thus, electrical resistances of the sensing lines TL may be reduced.

The first line portion L1 may be disposed between the first sensing insulating layer 71 and the second sensing insulating layer 72, and the second line portion L2 may be disposed between the second sensing insulating layer 72 and the third sensing insulating layer 73. The first line portion L1 and the second line portion L2 may penetrate the second sensing insulating layer 72 so as to be connected to each other.

In the present embodiment, the first connection line BRH1, the second connection line BRH2, the crack detecting pattern HCP and the crack detecting lines HCL1 and HCL2 may be disposed at the same layer. In the present embodiment, the second connection line BRH2, the crack detecting pattern HCP and the second crack detecting line HCL2 may be connected to each other to constitute a single unitary body shape. However, embodiments of the inventive concepts are not limited thereto. In another embodiment, the second connection line BRH2 may be stacked directly on the crack detecting pattern HCP and the second crack detecting line HCL2.

The second line portions L2 of the sensing lines TL may be removed in an area overlapping with the second connection line BRH2. Thus, the first line portion L1 may overlap with the second connection line BRH2 in a plan view, but the second line portion L2 may be spaced apart from the second connection line BRH2. Therefore, electrical connection between the sensing lines TL and the connection lines BRH1 and BRH2 may be prevented.

According to the embodiment of the inventive concepts, the crack detecting pattern HCP and the connection lines BRH1 and BRH2 may be disposed at the same layer. Thus, the crack detecting pattern HCP and the connection lines BRH1 and BRH2 may be formed using one mask at the same time, and thus processes may be simplified and process costs may be reduced. In addition, according to the embodiment of the inventive concepts, the crack detecting pattern HCP may be stably designed even though the hole area HA_E is defined adjacent to the peripheral area NAA, and thus reliability of the electronic panel 200_E may be improved.

Figure 10A:
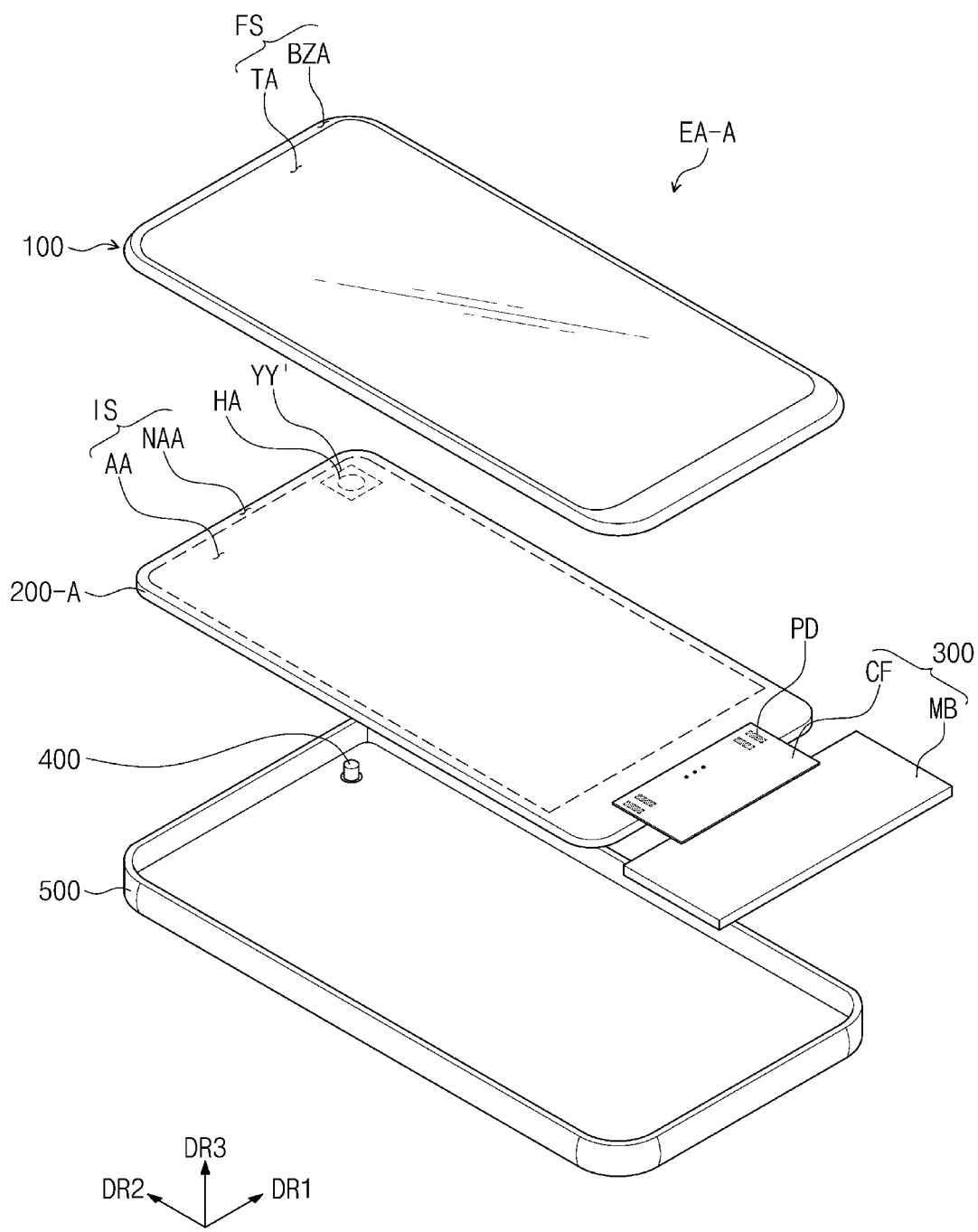
FIG. 10A is an exploded perspective view illustrating an electronic apparatus according to an embodiment of the inventive concepts.
Figure 10B:
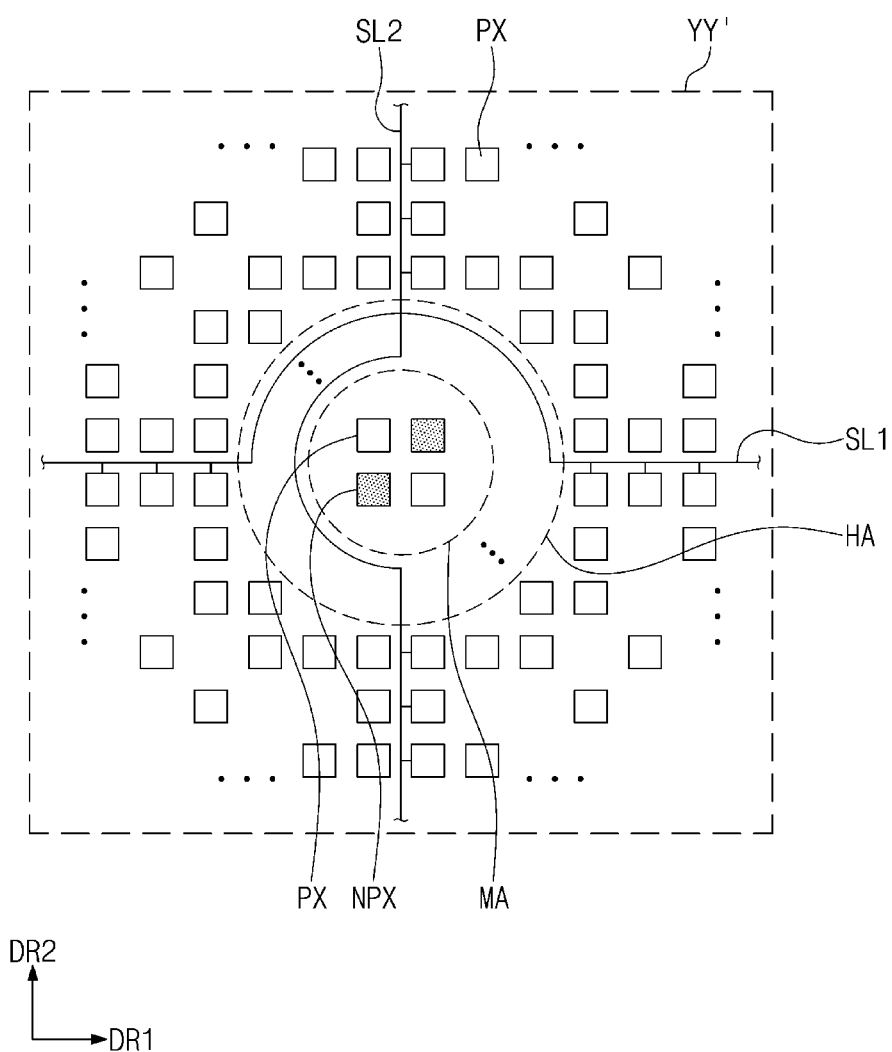
FIG. 10B is a plan view schematically illustrating an area YY' of FIG. 10A.
Figure 11A:
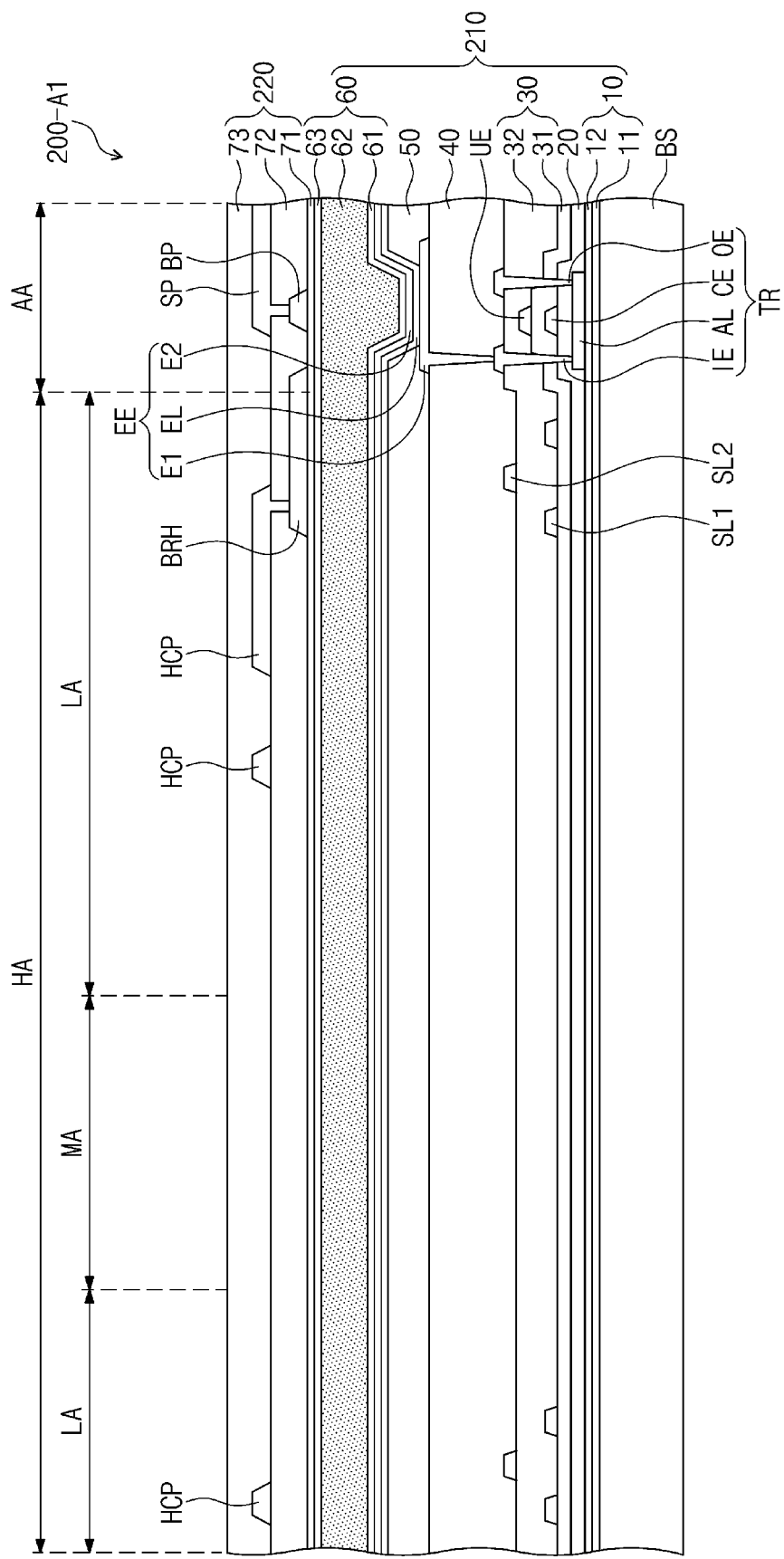
FIGS. 11A and 11B are cross-sectional views illustrating electronic panels according to some embodiments of the inventive concepts.
Figure 11B:
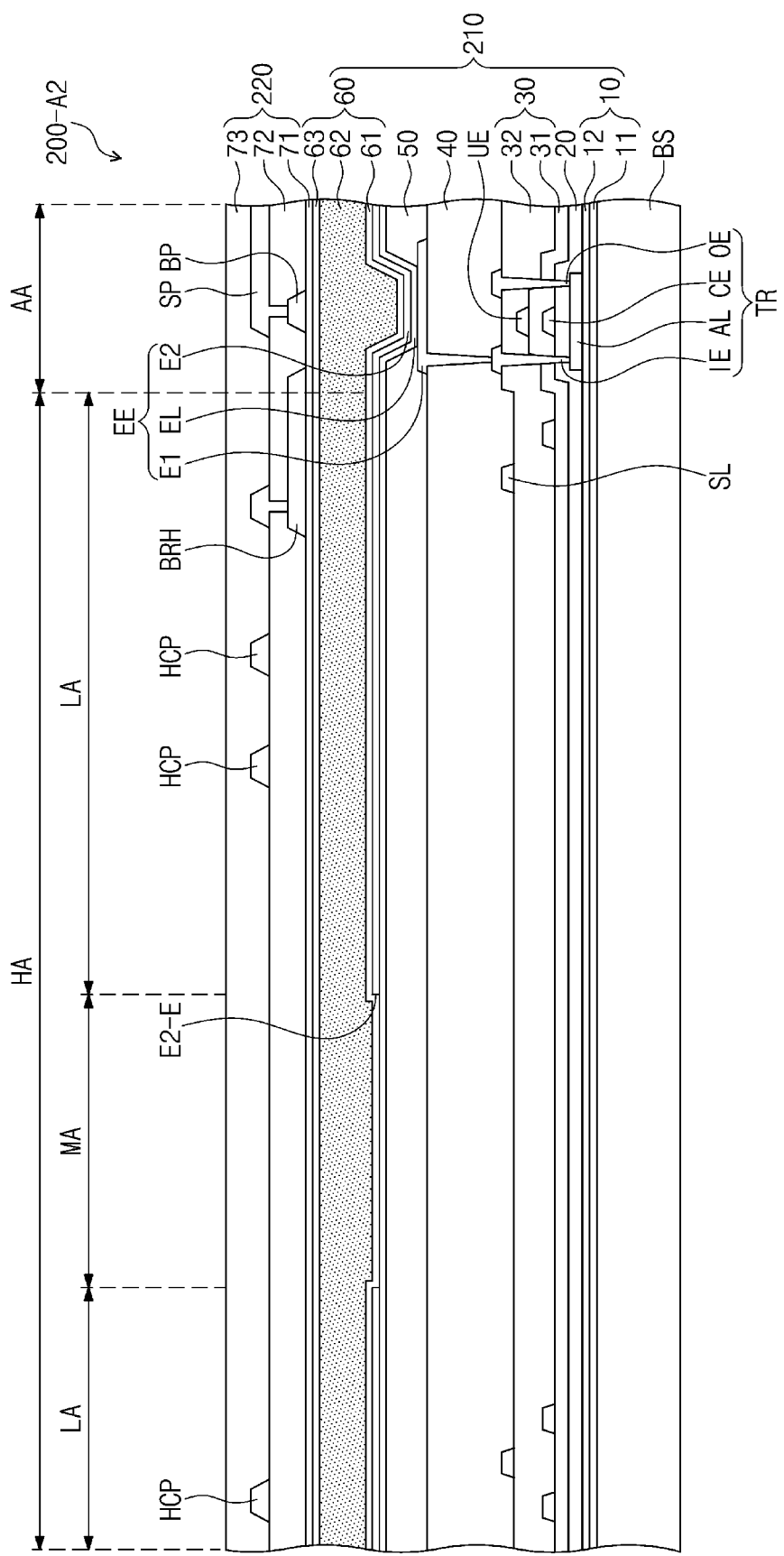

FIG. 10A is an exploded perspective view illustrating an electronic apparatus according to an embodiment of the inventive concepts. FIG. 10B is a plan view schematically illustrating an area YY' of FIG. 10A. FIGS. 11A and 11B are cross-sectional views illustrating electronic panels according to some embodiments of the inventive concepts. FIGS. 11A and 11B illustrate areas corresponding to FIG. 4. Hereinafter, embodiments of the inventive concepts will be described with reference to FIGS. 10A-11B. Meanwhile, the same components as described with reference to FIGS. 1A-9B will be indicated by the same reference numerals or designators, and the descriptions thereto may be omitted for the purpose of ease and convenience of description.

In an electronic apparatus EA-A according to an embodiment of the inventive concepts, the hole MH of FIG. 1B may be omitted. A hole area HA may include a module area MA and a line area LA.

The line area LA may be defined along an edge of the module area MA. The line area LA may surround the edge of the module area MA when viewed in a plan view (e.g., in a direction normal to the front surface FS). The hole area HA may correspond to an area including the module area MA and the line area LA.

An external signal inputted to the electronic module 400 and/or a signal outputted from the electronic module 400 may be transmitted through the module area MA.

A transmittance of the module area MA may be higher than a transmittance of an area of the active area AA in which the pixels PX are disposed. The electronic module 400 may sense an external object through the module area MA and/or may easily provide an outputted optical signal to the outside through the module area MA.

In the present embodiment, the module area MA may have a shape corresponding to the shape of the hole MH described above. For example, the module area MA may have a circular shape, an elliptical shape, a polygonal shape, a polygonal shape of which at least one side is curved, or any other suitable shape when viewed in a plan view (e.g., in a direction normal to the front surface FS).

At least one non-light emitting pixel NPX may be disposed in the module area MA according to the present embodiment. In FIG. 10B, two non-light emitting pixels NPX and two pixels PX are illustrated for the purpose of ease and convenience of description and illustration. A light transmittance of the non-light emitting pixel NPX may be higher than that of the pixel PX. The non-light emitting pixel NPX may be formed by removing at least a portion of the components of the pixel PX.

For example, the non-light emitting pixel NPX may be formed by removing the thin film transistor TR of the pixel PX. In other embodiments, the non-light emitting pixel NPX may be formed by removing the organic layer EL of the components of the pixel PX, by removing one or some components of the thin film transistor TR, or by removing only the first electrode E1 of the components of the pixel PX. In still other embodiments, the non-light emitting pixel NPX may be formed by removing all of the components of the pixel PX. In this case, the non-light emitting pixel NPX may be defined as a portion in which insulating layers are stacked.

The non-light emitting pixel NPX may be variously modified under the condition that the transmittance of the non-light emitting pixel NPX is higher than that of the pixel PX. In addition, the module area MA may have a plurality of the pixels PX and one non-light emitting pixel NPX or may have only a plurality of the non-light emitting pixels NPX, as long as the transmittance of the module area MA is higher than that of a surrounding area.

For example, as illustrated in FIG. 11A, the module area MA may be formed by removing the thin film transistor TR and the first electrode E1 of the pixel PX. The insulating layers may extend (e.g., continuously extend) in the module area MA.

In the hole area HA, the base substrate BS, the first to fifth insulating layers 10, 20, 30, 40 and 50, the organic layer EL, the encapsulation layer 60 and the sensing insulating layers 71, 72 and 73 may not be cut and may overlap with the module area MA. The base substrate BS, the first to fifth insulating layers 10, 20, 30, 40 and 50, the organic layer EL, the encapsulation layer 60 and the sensing insulating layers 71, 72 and 73 may be fully formed in the active area AA via the module area MA.

In the present embodiment, the second electrode E2 may also overlap with the module area MA. When the second electrode E2 is formed as a transparent or semi-transparent electrode, the module area MA having a higher transmittance than that of the area in which the pixel PX is disposed may be formed even though the second electrode E2 overlaps with the module area MA.

The crack detecting pattern HCP may be disposed in the line area LA and may surround the edge of the module area MA when viewed in a plan view (e.g., in a direction normal to the front surface SF). Because the crack detecting pattern HCP is disposed along the edge of the module area MA, a reduction in transmittance of the module area MA may be prevented.

In another embodiment, the second electrode E2 may be removed in the module area MA, as illustrated in FIG. 11B. An end portion E2-E which defines an opening overlapping with the module area MA may be formed at the second electrode E2.

Thus, even though the second electrode E2 is formed as a non-transparent electrode, the module area MA having an improved transmittance may be provided. In addition, even though the second electrode E2 is formed as a semi-transparent electrode, the module area MA having a higher transmittance than that of the module area MA of FIG. 11A may be provided.

According to the embodiments of the inventive concepts, an electronic module not requiring a high transmittance (e.g., an electronic module using infrared light) may easily transmit/receive a signal to/from the outside through the module area MA formed by removing opaque components. Even though the electronic module 400 overlaps with the electronic panel 200-A1 of FIG. 11A or 200-A2 of FIG. 11B, signal input/output with the outside may be stably performed. In addition, the electronic module 400 may be covered by the electronic panel 200-A1 or 200-A2, and thus the electronic module 400 may be stably protected from an external impact and/or an external contaminant.

According to the embodiments of the inventive concepts, it is possible to easily check or determine whether a crack occurs in the electronic panel or not. In addition, electrical damage of the circuit for sensing a crack may be prevented. As a result, the reliability of the electronic panel may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest reasonable interpretation of the following claims and their equivalents, and shall not be restricted or limited by the foregoing description.

What is claimed is:

1. An electronic panel comprising:
   a base substrate having a first area, a second area adjacent to the first area, and a third area adjacent to the second area;
   a plurality of pixels in the second area;
   a plurality of pixel signal lines in the third area and connected to the pixels;
   a crack detecting pattern spaced apart from the pixels and in the first area;
   a first line which is spaced apart from the pixel signal lines, located in the third area, and connected to a portion of the crack detecting pattern; and
   a second line which is spaced apart from the pixel signal lines, located in the third area, connected to another portion of the crack detecting pattern, and spaced apart from the first line,
   wherein the crack detecting pattern has a line-symmetrical shape with respect to a symmetry axis passing through a center of the first area,
   wherein a hole penetrating the electronic panel with the symmetry axis passing therethrough is defined in the first area, and
   wherein the crack detecting pattern is located along an edge of the hole.

2. The electronic panel of claim 1, wherein the first area comprises a module area and a line area around the module area, and
   wherein the crack detecting pattern comprises:
   a first extension portion in the line area, the first extension portion extending along an edge of the module area, and being located at a first side of the symmetry axis;
   a second extension portion in the line area, the second extension portion extending along the edge of the module area, being spaced apart from the first extension portion, and being located at a second side of the symmetry axis;
   a third extension portion in the line area, the third extension portion extending along the edge of the module area, being spaced apart from the first and second extension portions, and crossing the symmetry axis; and
   a first connecting portion and a second connecting portion that are connected to a first end of the first extension portion and a first end of the second extension portion, respectively, and are symmetrical with respect to the symmetry axis.

3. The electronic panel of claim 2, wherein the first connecting portion and the second connecting portion are parallel to the symmetry axis.

4. The electronic panel of claim 2, wherein a first end of the third extension portion is connected to the first connecting portion, and
   wherein a second end of the third extension portion is connected to the second connecting portion.

5. The electronic panel of claim 2, further comprising at least one non-light emitting pixel on the module area, and having a shape obtained by removing at least one of components included in others of the pixels.

6. The electronic panel of claim 1, wherein the crack detecting pattern has an open curve shape including a first end and a second end.

7. The electronic panel of claim 6, further comprising:
   a first connection line connecting the first line and the first end of the crack detecting pattern; and
   a second connection line connecting the second line and the second end of the crack detecting pattern,
   wherein the symmetry axis passes between the first connection line and the second connection line.

8. An electronic panel comprising:
   a base substrate having a first area, a second area adjacent to the first area, and a third area adjacent to the second area;
   a plurality of pixels in the second area;
   a plurality of pixel signal lines in the third area and connected to the pixels;
   a crack detecting pattern spaced apart from the pixels and in the first area;
   a first line which is spaced apart from the pixel signal lines, located in the third area, and connected to a portion of the crack detecting pattern; and
   a second line which is spaced apart from the pixel signal lines, located in the third area, connected to another portion of the crack detecting pattern, and spaced apart from the first line,
   wherein the crack detecting pattern has a line-symmetrical shape with respect to a symmetry axis passing through a center of the first area,
   wherein the first area comprises a module area and a line area around the module area,
   wherein the crack detecting pattern comprises:
   first extension portions in the line area, extending along an edge of the module area, and being located at a first side of the symmetry axis;
   second extension portions in the line area, extending along the edge of the module area, being spaced apart from the first extension portions, and being located at a second side of the symmetry axis;
   a third extension portion in the line area, the third extension portion extending along the edge of the module area, being spaced apart from the first and second extension portions, and crossing the symmetry axis;

first connecting portions that are respectively connected to the first extension portions; and second connecting portions that are respectively connected to the second extension portions, and that are symmetrical with the first connecting portions with respect to the symmetry axis.

9. The electronic panel of claim 8, wherein one of the first connecting portions is connected to a first end of the third extension portion, and wherein one of the second connecting portions is connected to a second end of the third extension portion.

10. The electronic panel of claim 9, wherein the first connecting portions are spaced apart from each other along a direction parallel to the symmetry axis, and wherein the second connecting portions are spaced apart from each other along the direction parallel to the symmetry axis.

11. The electronic panel of claim 10, wherein the first connecting portions and the second connecting portions are symmetrical with respect to the symmetry axis.

12. The electronic panel of claim 10, wherein the first connecting portions are aligned with each other along the direction parallel to the symmetry axis, and wherein the second connecting portions are aligned with each other along the direction parallel to the symmetry axis.

13. An electronic apparatus comprising:

an electronic panel configured to display an image and to sense an external input; and an electronic module overlapping with the electronic panel, wherein the electronic panel comprises:
   a base substrate having:
      a hole area in which a hole is defined;
      an active area adjacent to the hole area; and
      a peripheral area adjacent to the active area; and
   a crack detecting circuit comprising:
      a crack detecting pattern in the hole area and having an open curve shape along an edge of the hole;
      a first crack detecting line in the peripheral area and connected to a first end of the crack detecting pattern; and
      a second crack detecting line spaced apart from the first crack detecting line, in the peripheral area, and connected to a second end of the crack detecting pattern, and wherein the crack detecting pattern has a line-symmetrical shape with respect to a symmetry axis passing through a center of the hole area.

14. The electronic apparatus of claim 13, wherein the crack detecting pattern has a single unitary body shape.

15. The electronic apparatus of claim 14, wherein the crack detecting pattern comprises:

a first extension portion at a first side of the symmetry axis;

a second extension portion at a second side of the symmetry axis;

a third extension portion crossing the symmetry axis;

a first connecting portion connecting the first extension portion and a first end of the third extension portion; and a second connecting portion connecting the second extension portion and a second end of the third extension portion, wherein the first extension portion and the second extension portion are spaced apart from each other with the symmetry axis interposed therebetween and are line-symmetrical with respect to the symmetry axis, and wherein the first connecting portion and the second connecting portion are spaced apart from each other with the symmetry axis interposed therebetween and are line-symmetrical with respect to the symmetry axis.

16. The electronic apparatus of claim 15, wherein a minimum distance between the third extension portion and the first extension portion is substantially equal to a minimum distance between the third extension portion and the second extension portion.

17. The electronic apparatus of claim 13, wherein the crack detecting circuit further comprises:

a first connection line connecting the first end of the crack detecting pattern and the first crack detecting line; and a second connection line connecting the second end of the crack detecting pattern and the second crack detecting line, wherein the symmetry axis passes between the first connection line and the second connection line.

18. The electronic apparatus of claim 17, wherein the first connection line and the second connection line are connected to the first crack detecting line and the second crack detecting line via the active area.

19. The electronic apparatus of claim 13, wherein the electronic panel further comprises:

a plurality of sensing electrodes in the active area and comprising:
   a sensing insulating layer;
   first conductive patterns under the sensing insulating layer; and
   second conductive patterns at the sensing insulating layer, and wherein the crack detecting pattern is at the same layer as the second conductive patterns.

\* \* \* \* \*